US012331234B2

(12) United States Patent
Kim et al.

(10) Patent No.: US 12,331,234 B2
(45) Date of Patent: *Jun. 17, 2025

(54) QUANTUM DOT, CURABLE COMPOSITION COMPRISING THE SAME, CURED LAYER USING THE COMPOSITION, COLOR FILTER INCLUDING THE CURED LAYER, DISPLAY DEVICE INCLUDING THE CURED LAYER AND METHOD OF MANUFACTURING THE CURED LAYER

(71) Applicant: Samsung SDI Co., Ltd., Yongin-si (KR)

(72) Inventors: Jonggi Kim, Suwon-si (KR); Yonghee Kang, Suwon-si (KR); Dongjun Kim, Suwon-si (KR); Misun Kim, Suwon-si (KR); Minjee Park, Suwon-si (KR); Bumjin Lee, Suwon-si (KR); Jihyeon Yim, Suwon-si (KR); Mi Jeong Choi, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 649 days.

This patent is subject to a terminal disclaimer.

(21) Appl. No.: 16/742,855

(22) Filed: Jan. 14, 2020

(65) Prior Publication Data
US 2020/0231871 A1   Jul. 23, 2020

(30) Foreign Application Priority Data

Jan. 21, 2019   (KR) .................. 10-2019-0007594

(51) Int. Cl.
| | |
|---|---|
| *C09K 11/02* | (2006.01) |
| *C08F 2/40* | (2006.01) |
| *C08F 292/00* | (2006.01) |
| *G02B 5/23* | (2006.01) |
| *G03F 7/20* | (2006.01) |
| *B82Y 20/00* | (2011.01) |
| *B82Y 30/00* | (2011.01) |
| *C09D 11/38* | (2014.01) |

(52) U.S. Cl.
CPC ............. *C09K 11/02* (2013.01); *C08F 2/40* (2013.01); *C08F 292/00* (2013.01); *G02B 5/23* (2013.01); *G03F 7/2018* (2013.01); *B82Y 20/00* (2013.01); *B82Y 30/00* (2013.01); *C09D 11/38* (2013.01); *G02B 2207/101* (2013.01)

(58) Field of Classification Search
CPC .......... C09K 11/02; G02B 5/23; B82Y 20/00; C08F 2/20; C08F 292/00; C08F 2/40; G03F 7/2018
See application file for complete search history.

(56) References Cited

U.S. PATENT DOCUMENTS

| | | |
|---|---|---|
| 7,041,371 B2 | 5/2006 | Ogura et al. |
| 7,361,516 B2 | 4/2008 | Uyeda et al. |
| 7,648,843 B2 | 1/2010 | Uyeda et al. |
| 7,794,917 B2 | 9/2010 | Mori et al. |
| 8,741,177 B2 | 6/2014 | Pickett et al. |
| 8,889,429 B2 | 11/2014 | Cao et al. |
| 9,263,639 B2 | 2/2016 | Aoki et al. |
| 9,446,152 B2 | 9/2016 | Mattoussi et al. |
| 10,988,685 B2 | 4/2021 | Ahn et al. |
| 11,912,911 B2 | 2/2024 | Kang et al. |
| 2001/0023078 A1 | 9/2001 | Bawendi et al. |
| 2004/0007169 A1 | 1/2004 | Ohtsu et al. |
| 2009/0212258 A1* | 8/2009 | McCairn ............ C08G 65/3344 252/301.36 |
| 2012/0041142 A1 | 2/2012 | Nennemann et al. |
| 2013/0345458 A1 | 12/2013 | Freeman et al. |
| 2014/0192396 A1 | 7/2014 | Schram et al. |
| 2014/0264196 A1 | 9/2014 | Werner et al. |
| 2014/0275431 A1 | 9/2014 | Freeman et al. |
| 2015/0267106 A1 | 9/2015 | Pillay Narrainen et al. |
| 2016/0011506 A1* | 1/2016 | Gu ......................... G03F 7/029 430/281.1 |
| 2016/0289552 A1 | 10/2016 | Werner et al. |
| 2018/0102449 A1 | 4/2018 | Pschenitzka et al. |
| 2018/0142149 A1 | 5/2018 | Youn et al. |
| 2018/0149974 A1 | 5/2018 | Kim et al. |

(Continued)

FOREIGN PATENT DOCUMENTS

| | | |
|---|---|---|
| CN | 101391756 A | 3/2009 |
| CN | 102086396 A | 6/2011 |
| CN | 102277158 A | 12/2011 |
| CN | 102517025 A | 6/2012 |
| CN | 103896776 A | 7/2014 |
| CN | 105070849 A | 11/2015 |
| CN | 105131712 A | 12/2015 |
| CN | 105189584 A | 12/2015 |
| CN | 105247010 A | 1/2016 |
| CN | 106206972 A | 12/2016 |

(Continued)

OTHER PUBLICATIONS

Cheolsang Yoon, Hyun-Guk Hong, Hyun Chang Kim, Daehyun Hwang , Young-Joo Kimb,, Kangtaek Lee, High luminescence efficiency white light emitting diodes based on surface functionalized quantum dots dispersed in polymer matrices, Colloids and Surfaces A: Physicochem. Eng. Aspects 428 (2013) 86-91. (Year: 2013).*

(Continued)

*Primary Examiner* — Bijan Ahvazi
(74) *Attorney, Agent, or Firm* — Womble Bond Dickinson (US) LLP

(57) ABSTRACT

A quantum dot surface-modified with a ligand, a non-solvent curable composition including the quantum dot, a solvent-based curable composition including the quantum dot, a cured layer manufactured utilizing the curable composition, a color filter including the cured layer, a display device including the color filter, and a method of manufacturing the cured layer are disclosed.

21 Claims, No Drawings

(56) References Cited

U.S. PATENT DOCUMENTS

| | | | |
|---|---|---|---|
| 2018/0179441 A1 | 6/2018 | Park et al. | |
| 2018/0354222 A1* | 12/2018 | Calabrese | B31B 70/64 |
| 2018/0354244 A1 | 12/2018 | Jen-La Plante et al. | |
| 2018/0355244 A1 | 12/2018 | Lüchinger et al. | |
| 2019/0011782 A1 | 1/2019 | Pickett et al. | |
| 2019/0077954 A1 | 3/2019 | Tangirala et al. | |
| 2019/0129302 A1* | 5/2019 | Youn | G03F 7/105 |
| 2019/0278177 A1 | 9/2019 | Jeong et al. | |
| 2020/0248068 A1 | 8/2020 | Choi et al. | |
| 2020/0264461 A1 | 8/2020 | Kuwana et al. | |
| 2020/0317998 A1 | 10/2020 | Nojima | |
| 2022/0213380 A1 | 7/2022 | Kang et al. | |

FOREIGN PATENT DOCUMENTS

| | | | | |
|---|---|---|---|---|
| CN | 106468856 A | 3/2017 | | |
| CN | 106863935 A | 6/2017 | | |
| CN | 106957645 A | 7/2017 | | |
| CN | 107722184 A | 2/2018 | | |
| CN | 108102640 A | 6/2018 | | |
| CN | 108107679 A | 6/2018 | | |
| CN | 108219771 A | 6/2018 | | |
| CN | 108445713 A | 8/2018 | | |
| CN | 108445715 A | 8/2018 | | |
| CN | 109476989 A | 3/2019 | | |
| CN | 109749733 A | 5/2019 | | |
| CN | 109952359 A | 6/2019 | | |
| CN | 109994619 A | 7/2019 | | |
| CN | 110205111 A | 9/2019 | | |
| CN | 110297391 A | 10/2019 | | |
| EP | 2105793 B1 | 5/2016 | | |
| JP | 05-072723 A | 3/1993 | | |
| JP | 2002-121549 A | 4/2002 | | |
| JP | 2003-137912 A | 5/2003 | | |
| JP | 2009-132771 A | 6/2009 | | |
| JP | 2010-118434 A | 5/2010 | | |
| JP | 2011-122033 A | 6/2011 | | |
| JP | 2016-98375 A | 5/2016 | | |
| JP | 2016098375 A * | 5/2016 | | C09K 11/08 |
| JP | 2016-519175 A | 6/2016 | | |
| JP | 2017-32918 A | 2/2017 | | |
| JP | 6093179 B2 | 3/2017 | | |
| JP | 2017-106006 A | 6/2017 | | |
| JP | 2017-137451 A | 8/2017 | | |
| JP | 6236412 B2 | 11/2017 | | |
| JP | 2018-84823 A | 5/2018 | | |
| JP | 2018-91924 A | 6/2018 | | |
| JP | 2018131613 A * | 8/2018 | | C09D 5/22 |
| JP | 2018-153915 A | 10/2018 | | |
| JP | 2019-85568 A | 6/2019 | | |
| JP | 2020-41080 A | 3/2020 | | |
| JP | 2020-105491 A | 7/2020 | | |
| JP | 2020-118971 A | 8/2020 | | |
| JP | 2021-501230 A | 1/2021 | | |
| KR | 1992-7002502 A | 9/1992 | | |
| KR | 1994-0005617 B1 | 6/1994 | | |
| KR | 1995-7000359 A | 1/1995 | | |
| KR | 1995-0011163 B1 | 9/1995 | | |
| KR | 10-2009-0078099 A | 7/2009 | | |
| KR | 10-2010-0138925 A | 12/2010 | | |
| KR | 10-2014-0072682 A | 6/2014 | | |
| KR | 10-2015-0023849 A | 3/2015 | | |
| KR | 10-2015-0052759 A | 5/2015 | | |
| KR | 10-2015-0098691 A | 8/2015 | | |
| KR | 10-2016-0022158 A | 2/2016 | | |
| KR | 10-2016-0097445 A | 8/2016 | | |
| KR | 10-2016-0114292 A | 10/2016 | | |
| KR | 10-2016-0119149 A | 10/2016 | | |
| KR | 10-2016-0135763 A | 11/2016 | | |
| KR | 10-2016-0142100 A | 12/2016 | | |
| KR | 10-2017-0006024 A | 1/2017 | | |
| KR | 10-2017-0022951 A | 3/2017 | | |
| KR | 10-2017-0028306 A | 3/2017 | | |
| KR | 10-2017-0035688 A | 3/2017 | | |
| KR | 10-2017-0047125 A | 5/2017 | | |
| KR | 10-2017-0060400 A | 6/2017 | | |
| KR | 10-2017-0073249 A | 6/2017 | | |
| KR | 10-2017-0075478 A | 7/2017 | | |
| KR | 10-2017-0101002 A | 9/2017 | | |
| KR | 10-2017-0106048 A | 9/2017 | | |
| KR | 10-2017-0106791 A | 9/2017 | | |
| KR | 10-2017-0141005 A | 12/2017 | | |
| KR | 10-2018-0025248 A | 3/2018 | | |
| KR | 10-2018-0027617 A | 3/2018 | | |
| KR | 10-1839700 B1 | 3/2018 | | |
| KR | 10-2018-0059363 A | 6/2018 | | |
| KR | 10-2018-0059724 A | 6/2018 | | |
| KR | 10-2018-0080507 A | 7/2018 | | |
| KR | 10-2018-0092671 A | 8/2018 | | |
| KR | 10-2018-0106125 A | 10/2018 | | |
| KR | 10-2018-0111082 A | 10/2018 | | |
| KR | 10-1895909 B1 | 10/2018 | | |
| KR | 10-1909541 B1 | 10/2018 | | |
| KR | 10-2019-0004536 A | 1/2019 | | |
| KR | 10-2019-0007069 A | 1/2019 | | |
| KR | 10-2019-0047573 A | 5/2019 | | |
| KR | 10-2019-0062442 A | 6/2019 | | |
| KR | 10-1971586 B1 | 6/2019 | | |
| KR | 10-2019-0095070 A | 8/2019 | | |
| KR | 10-2019-0102857 A | 9/2019 | | |
| KR | 10-2019-0108366 A | 9/2019 | | |
| KR | 20190108366 A * | 9/2019 | | G02B 5/20 |
| KR | 10-2019-0110935 A | 10/2019 | | |
| KR | 10-2019-0112631 A | 10/2019 | | |
| KR | 10-2020-0041937 A | 4/2020 | | |
| KR | 10-2020-0060430 A | 5/2020 | | |
| KR | 10-2226069 B1 | 3/2021 | | |
| KR | 10-2296792 B1 | 8/2021 | | |
| TW | 201213452 A1 | 4/2012 | | |
| TW | 201239044 A1 | 10/2012 | | |
| TW | 201243002 A1 | 11/2012 | | |
| TW | 201634604 A | 10/2016 | | |
| TW | 201643221 A | 12/2016 | | |
| TW | 201730671 A | 9/2017 | | |
| TW | 201809216 A | 3/2018 | | |
| TW | 201825648 A | 7/2018 | | |
| TW | 201835298 A | 10/2018 | | |
| TW | 201835652 A | 10/2018 | | |
| TW | 201920612 A | 6/2019 | | |
| TW | 201923461 A | 6/2019 | | |
| TW | 201925420 A | 7/2019 | | |
| WO | WO 2000/017656 A1 | 3/2000 | | |
| WO | 2005/093422 A2 | 10/2005 | | |
| WO | WO 2010/039897 A2 | 4/2010 | | |
| WO | 2017/002833 A1 | 1/2017 | | |
| WO | WO 2017/008442 A | 1/2017 | | |
| WO | WO 2017/019789 A1 | 2/2017 | | |
| WO | WO 2017/150112 A1 | 9/2017 | | |
| WO | 2018/051961 A1 | 3/2018 | | |
| WO | 2018/071308 A1 | 4/2018 | | |
| WO | 2018/105545 A1 | 6/2018 | | |
| WO | WO 2018/226925 A1 | 12/2018 | | |
| WO | 2019/008374 A1 | 1/2019 | | |
| WO | WO 2019/030680 A1 | 2/2019 | | |
| WO | WO 2019/072882 A1 | 4/2019 | | |
| WO | WO 2019/084119 A1 | 5/2019 | | |
| WO | WO 2019/111617 A1 | 6/2019 | | |
| WO | WO 2019-167751 A | 9/2019 | | |

OTHER PUBLICATIONS

U.S. Office Action dated Dec. 14, 2021, issued in U.S. Appl. No. 16/742,875 (12 pages).
Korean Office Action dated May 7, 2021, issued in corresponding Korean Patent Application No. 10-2019-0007594 (10 pages).
Korean Notice of Allowance dated Jun. 18, 2021, issued in Korean Patent Application No. 10-2019-0014094 (2 pages).
Third Party Observations dated Aug. 2, 2022, issued in corresponding Korean Patent Application No. 10-2021-0088862 (2 pages).
Korean Office Action, with English translation, dated Mar. 28, 2022 for Korean Patent Application No. 10-2019-0007594 (17 pages).
US Notice of Allowance dated Oct. 20, 2022, issued in U.S. Appl. No. 16/155,691 (8 pages).

(56) References Cited

OTHER PUBLICATIONS

Chinese Office Action dated Dec. 1, 2021, issued in Chinese Patent Application No. 202010042364.1. (9 pages).
Beland, Vanessa A., et al., "Antimony-functionalized phosphine-based photopolymer networks," Angewandte Chemie International Edition, 2018, 7 pages.
Taiwanese Office Action dated Dec. 2, 2020, issued in Taiwanese Patent Application No. 109101093 (6 pages).
Japanese Office Action dated Feb. 16, 2021, issued in Japanese Patent Application Appl. No. 2020-029726 (3 pages).
Taiwanese Office Action dated Feb. 22, 2021, issued in corresponding Taiwanese Patent Application No. 109101173 (9 pages).
Korean Office Action dated Feb. 28, 2021, issued in Korean Patent Application No. 10-2019-0014094 (6 pages).
Japanese Office Action dated Sep. 28, 2021, issued in Japanese Patent Application No. 2020-006789 (3 pages).
Ping, He, "Decorative Materials," 1st Edition, Southeast University Press, 2nd printing, Aug. 2002, Abstract, 5 pages.
Chengbin, Mu, "Communication Optical Fiber and Cable Materials and Industry Development," 1st Edition, Tongji University Press, Jun. 2015, Abstract, 4 pages.
Chinese Office Action dated Jun. 13, 2022, issued in Chinese Patent Application No. 202010042364.1 (8 pages).
Beland, Vanessa A., et al., "Antimony-functionalized phosphine-based photopolymer networks," Angewandte Chemie International Edition, vol. 57, Issue 40, 2018, 7 pages.
Korean Office Action dated Jul. 22, 2021, issued in Korean Patent Application No. 10-2019-0047931 (4 pages).
U.S. Office Action from U.S. Appl. No. 16/155,691, dated Apr. 11, 2022, 8 pages.
U.S. Office Action from U.S. Appl. No. 16/742,875, dated Apr. 11, 2022, 13 pages.
U.S. Restriction Requirement from U.S. Appl. No. 16/742,861, dated Apr. 28, 2022, 9 pages.
Dawei Deng, et al., Forming highly fluorescent near-infrared emitting PbS quantum dots in water using glutathione as surface-modifying molecule, Journal of Colloid and Interface Science, 2012, pp. 234-240, vol. 367, Iss. 1, Elsevier Inc.
English Abstract for foreign reference KR 10-2019-0102857 A.
English translation of Japanese Office Action, for Patent Application No. 2020-006789, mailed Jan. 5, 2021, 3 pages.
English translation of Japanese Office Action, for Patent Application No. 2020-006789, mailed Sep. 28, 2021, 3 pages.
English translation of Korean Office Action, for Patent Application No. 10-2019-0007594, mailed May 7, 2021, 11 pages.
English translation of Korean Office Action, for Patent Application No. 10-2019-0014094, mailed Feb. 28, 2021, 6 pages.
English translation of Korean Office Action, for Patent Application No. 10-2019-0047931, mailed Jul. 22, 2021, 5 pages.
International Search Report issued in corresponding International Application No. PCT/KR2018/006007, dated Sep. 4, 2018, 3 pages.
Japanese Decision for grant dated Dec. 21, 2021, for Application No. JP 2020-521309, 3 pages.
Japanese Office Action dated Apr. 27, 2021 for Application No. JP 2020-521309, 4 pages.
Korean Intellectual Property Office Action for corresponding Korean Patent Application No. 10-2018-0023868, dated Jun. 1, 2020, 7 pages.
Korean Notice of Allowance dated Apr. 21, 2021 for Application No. KR 10-2018-0023867, 2 pages.
Korean Notification of Third Party Observations, for Patent Application No. KR 10-2021-0088862, mailed Jan. 26, 2022, 2 pages.
Korean Office Action dated Aug. 19, 2020, issued in corresponding Korean Patent Application No. 10-2018-0023867, 6 pages.
Office Action (including a search report) dated Dec. 29, 2021, of the corresponding Chinese Patent Application No. 201880063935.0, 13pp.
"Study on the properties of QDs with different ligand structures", May 26, 2013, 80pp.
Taiwanese Office Action dated Sep. 9, 2019, for corresponding Taiwanese Patent Application No. 107135471 (9 pages).
U.S. Office Action from U.S. Appl. No. 16/155,691, dated Aug. 27, 2021, 12 pages.
U.S. Office Action from U.S. Appl. No. 16/155,691, dated Dec. 13, 2021, 9 pages.
U.S. Restriction Requirement from U.S. Appl. No. 16/155,691, dated May 14, 2021, 6 pages.
Japanese Office Action dated Jan. 5, 2021, issued in corresponding Japanese Patent Application No. 2020-006250 (4 pages).
Japanese Office Action dated Jan. 5, 2021, issued in Japanese Patent Application No. 2020-006789 (3 pages).
Taiwanese Patent Office Action and Search Report for corresponding Taiwanese Patent Application No. 109101173, dated Jul. 23, 2020, 14 pages.
Taiwanese Patent Office Action and Search Report for corresponding Taiwanese Patent Application No. 109101997, dated Jul. 23, 2020, 16 pages.
English translation of Japanese Decision for Grant for JP Application No. JP 2020-521309 dated Dec. 21, 2021, 3 pages.
English translation of Japanese Office Action for JP Application No. JP 2020-521309, dated Apr. 27, 2021, 4 pages.
English translation of Korean Intellectual Property Office Action for KR Application No. 10-2018-0023868 dated Jun. 1, 2020, 7 pages.
English translation of Korean Notice of Allowance for KR Application No. 10-2018-0023867 dated Apr. 21, 2021, 2 pages.
English translation of Korean Notification of Third Party Observations for KR Application No. 10-2021-0088862 dated Jan. 26, 2022, 2 pages.
English translation of Korean Office Action for KR Application No. 10-2018-0023867 dated Aug. 19, 2020, 6 pages.
Korean Office Action for KR Application No. 10-2019-0007594 dated May 28, 2022, 8 pages.
Beland, Vanessa, et al, "Antimony-Functionalized Phosphine-Based Photopolymer Networks," Angew. Chem., 2018, vol. 130, 5 pages.
International Search Report and Written Opinion of the International Searching Authority dated on Apr. 13, 2020, for International Application No. PCT/KR2020/000037 (7 pages).
Notice of Allowance for U.S. Appl. No. 16/155,691 dated Jul. 14, 2022, 8 pages.
Office Action for U.S. Appl. No. 16/742,861 dated Jul. 12, 2022, 9 pages.
Office Action for U.S. Appl. No. 16/742,875 dated Jul. 18, 2022, 10 pages.
Li Hua, et al., "Research Progress in Synthesis and Application of Quantum Dots," Journal of Jilin Institute of Architecture & Civil Engineering, Dec. 2014, 4 pages.
Chinese Office Action, Search Report, dated Feb. 25, 2023, issued in corresponding Chinese Patent Application No. 202010022282.0 (3 pages).
Korean Office Action dated Dec. 28, 2022, issued in Korean Patent No. 10-2296792 (Korean Application No. 10-2019-0014094), 6 pages.
US Notice of Allowance dated Jan. 19, 2023, issued in U.S. Appl. No. 16/155,691 (7 pages).
Notice of Allowance for U.S. Appl. No. 16/742,861 dated Nov. 9, 2022, 10 pages.
Notice of Allowance for U.S. Appl. No. 16/742,875 dated Nov. 3, 2022, 7 pages.
Restriction Requirement for U.S. Appl. No. 16/742,857 dated Nov. 9, 2022, 9 pages.
Breus, Vladimir V., et al., "Quenching of CdSe-ZnS Core-Shell Quantum Dot Luminescence by Water-Soluble Thiolated Ligands," J. Phys. Chem. C, 2007, pp. 18589-18594.
Zhu, Huaping, et al., "Synthesis and Optical Properties of Thiol Functionalized CdSe/ZnS(Core/Shell) Quantum Dots by Ligand Exchange," Journal of Nanomaterials, 2014, 15 pages.
Chinese Notice of Allowance dated Oct. 21, 2022, issued in Chinese Patent Application No. 201880063935.0 (5 pages).
Japanese Notice of Allowance dated Feb. 21, 2023, issued in Japanese Patent Application No. 2021-121430 (3 pages).
US Office Action dated May 19, 2023, issued in U.S. Appl. No. 16/742,857 (9 pages).

(56) References Cited

OTHER PUBLICATIONS

International Search Report for corresponding PCT International Application No. PCT/KR2020/012595 mailed Dec. 24, 2020, 4pp.
Varga, Krisztina et al.; "CdSe Quantum Dots Functionalized with Chiral, Thiol-Free Carboxylic Acids: Unraveling Structural Requirements for Ligand-Induced Chirality"; ACS Nano 2017; 11; pp. 9846-9853.
US Office Action dated Jun. 14, 2024, issued in U.S. Appl. No. 18/516,818 (8 pages).
Chinese Office Action dated Jun. 20, 2024, issued in Chinese Patent Application No. 202010036364.0 (6 pages).
Chinese Search Report for corresponding CN Application No. 2020110385025, dated Jun. 14, 2023, 3 pages.
Japanese Office Action for corresponding JP Application No. 2020-165520, dated Jan. 18, 2022, 3 pages.
Japanese Office Action for corresponding JP Application No. 2020-165520, dated Sep. 14, 2021, 3 pages.
Taiwanese Office Action and Search Report, for corresponding TW Application No. 109132996, dated Jun. 9, 2021, 8 pages.
Taiwanese Office Action and Search Report, for the corresponding TW Patent Application No. 109132996, dated Mar. 28, 2022, 8 pages.
US Office Action dated Sep. 10, 2024, issued in U.S. Appl. No. 17/595,497 (7 pages).
US Office Action dated Feb. 10, 2025, issued in U.S. Appl. No. 18/446,373 (13 pages).

\* cited by examiner

QUANTUM DOT, CURABLE COMPOSITION COMPRISING THE SAME, CURED LAYER USING THE COMPOSITION, COLOR FILTER INCLUDING THE CURED LAYER, DISPLAY DEVICE INCLUDING THE CURED LAYER AND METHOD OF MANUFACTURING THE CURED LAYER

CROSS-REFERENCE TO RELATED APPLICATION

This application claims priority to and the benefit of Korean Patent Application No. 10-2019-0007594, filed in the Korean Intellectual Property Office on Jan. 21, 2019, the entire content of which is incorporated herein by reference.

BACKGROUND

1. Field

This disclosure relates to a quantum dot, a curable composition including the same, a cured layer manufactured utilizing the composition, a color filter including the cured layer, a display device including the cured layer, and a method of manufacturing the cured layer.

2. Description of the Related Art

In the case of general (e.g., related art) quantum dots, due to hydrophobic surface characteristics, a solvent in which the quantum dots can be dispersed is limited. Thus, it is difficult to introduce (e.g., add) the quantum dots into a polar system such as a binder or a curable monomer.

For example, even in the case of a quantum dot ink composition (which is being actively researched), a polarity thereof is relatively low in an initial step and it may be dispersed in a solvent utilized in the curable composition having a high hydrophobicity. Because it is difficult to increase quantum dots to be 20 wt % or more based on a total amount of the composition, it is therefore difficult (e.g., impossible) to increase light efficiency (e.g., luminous efficiency, quantum efficiency, etc.) of the ink over a certain level. Even though quantum dots are additionally added and dispersed in order to increase light efficiency, a viscosity exceeds a range (e.g., 12 cPs) capable of ink-jetting and processability may be unsatisfactory. That is, when the viscosity of the quantum dot ink composition exceeds the range suitable (e.g., 12 cPs) for ink-jet printing due to the addition of additional quantum dots, processability may be compromised.

In order to achieve the viscosity range capable of (e.g., suitable for) ink-jetting, a method of lowering an ink solid content by dissolving (e.g., adding) 50 wt % or more of a solvent based on a total amount of the composition has been utilized, which also provides a somewhat satisfactory result in terms of viscosity. However, it may be considered to be a satisfactory result in terms of viscosity, but nozzle drying (due to solvent volatilization (e.g., evaporation)), nozzle clogging, reduction of a layer (e.g., reduction of a layer width or thickness) as time passed after jetting may become worse and it is difficult to control a thickness deviation after curing. Thus, it is difficult to apply it (e.g., this method) to actual processes.

Therefore, a non-solvent based quantum dot ink that does not include a solvent is the embodied (e.g., most preferable) form to be applied to an actual process. The current technique of applying a quantum dot itself to a solvent-based composition is now limited to a certain extent.

Currently, the embodied (e.g., most preferred) solvent-based composition to be applied to actual processes is that the quantum dots, which are not surface-modified, such as ligand-substitution, are included in a content of about 20 wt % to 25 wt % based on a total amount of the solvent-based composition. Therefore, it is difficult to increase light efficiency and absorption rate due to the viscosity limitation. Meanwhile, attempts have been made to lower the quantum dot content and increase the content of the light diffusing agent (scatterer) in other improvement directions, but this has also failed to solve a sedimentation problem and a low light efficiency problem.

SUMMARY

An aspect according to embodiments of the present disclosure is directed toward providing a surface-modified quantum dot having improved optical characteristics.

Another aspect according to embodiments of the present disclosure is directed toward providing a quantum dot-containing non-solvent based curable composition.

Another aspect according to embodiments of the present disclosure is directed toward providing a solvent-based curable composition including the quantum dot.

Another aspect according to embodiments of the present disclosure is directed toward providing a cured layer manufactured utilizing the composition.

Another aspect according to embodiments of the present disclosure is directed toward providing a color filter including the cured layer.

Another aspect according to embodiments of the present disclosure is directed toward providing a display device including the cured layer and/or the color filter.

Another aspect according to embodiments of the present disclosure is directed toward providing a method of manufacturing the cured layer.

According to an embodiment, a quantum dot surface-modified with one or more of compounds represented by Chemical Formula 1 to Chemical Formula 14 is provided.

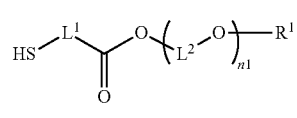

Chemical Formula 1

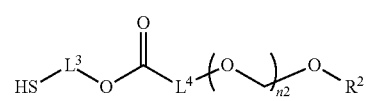

Chemical Formula 2

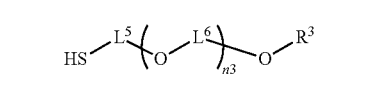

Chemical Formula 3

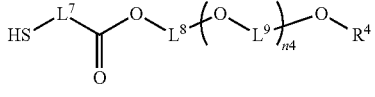

Chemical Formula 4

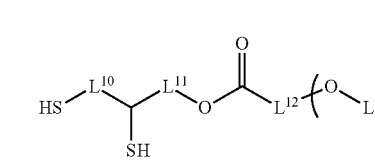

Chemical Formula 5

Chemical Formula 6

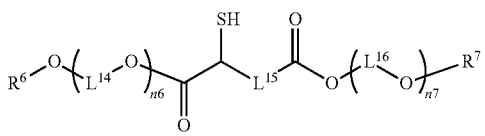

In Chemical Formula 1 to Chemical Formula 6, $R^1$ to $R^7$ are each independently a substituted or unsubstituted C1 to C10 alkyl group or a substituted or unsubstituted C6 to C20 aryl group, $L^1$ to $L^{16}$ are each independently a substituted or unsubstituted C1 to C10 alkylene group, and n1 to n7 are each independently an integer of 0 to 10.

Chemical Formula 7

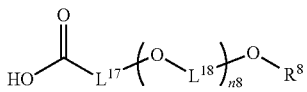

Chemical Formula 8

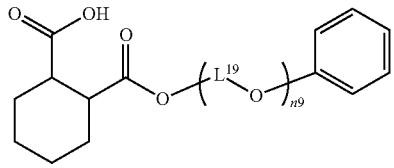

Chemical Formula 9

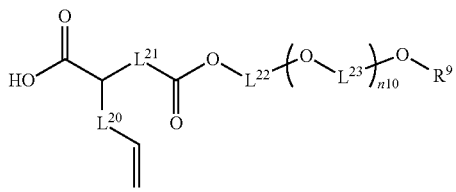

In Chemical Formula 7 to Chemical Formula 9, $R^8$ and $R^9$ are each independently a substituted or unsubstituted C1 to C10 alkyl group, $L^{17}$ to $L^{23}$ are each independently a substituted or unsubstituted C1 to C10 alkylene group, and n8 to n10 are each independently an integer of 0 to 10.

Chemical Formula 10

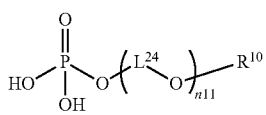

Chemical Formula 11

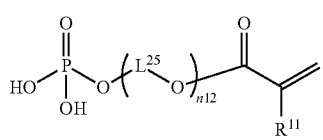

Chemical Formula 12

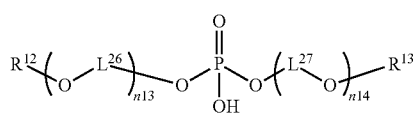

Chemical Formula 13

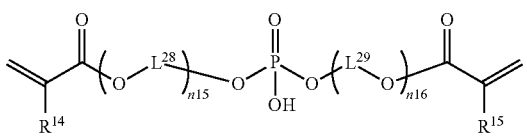

In Chemical Formula 10 to Chemical Formula 13, $R^{10}$ to $R^{15}$ are each independently a hydrogen atom or a substituted or unsubstituted C1 to C10 alkyl group, $L^{24}$ to $L^{29}$ are each independently a substituted or unsubstituted C1 to C10 alkylene group, and n11 to n16 are each independently an integer of 0 to 10.

Chemical Formula 14

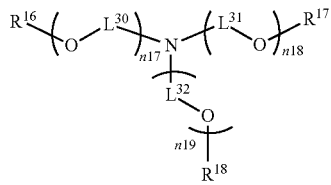

In Chemical Formula 14, $R^{16}$ to $R^{18}$ are each independently a substituted or unsubstituted C1 to C10 alkyl group, $L^{30}$ to $L^{32}$ are each independently a substituted or unsubstituted C1 to C10 alkylene group, and n17 to n19 are each independently an integer of 0 to 10.

The quantum dot may have a maximum fluorescence emission wavelength at about 500 nm to about 680 nm.

According to another embodiment, a non-solvent curable composition includes a quantum dot and a polymerizable monomer having a carbon-carbon double bond at a terminal end of the polymerizable monomer, and the polymerizable monomer is about 40 wt % to about 80 wt % in amount based on a total weight of the non-solvent curable composition.

The polymerizable monomer may have a molecular weight of about 220 g/mol to about 1,000 g/mol.

The polymerizable monomer may be represented by Chemical Formula 15.

Chemical Formula 15

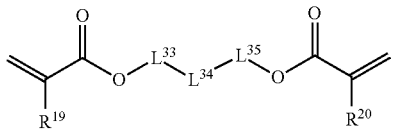

In Chemical Formula 15, $R^{19}$ and $R^{20}$ are each independently a hydrogen atom or a substituted or unsubstituted C1 to C10 alkyl group, $L^{33}$ and $L^{35}$ are each independently a substituted or unsubstituted C1 to C10 alkylene group, and $L^{34}$ is a substituted or unsubstituted C1 to C10 alkylene group or an ether group.

The non-solvent curable composition may further include a polymerization initiator, a light diffusing agent, or a combination thereof.

The light diffusing agent may be barium sulfate, calcium carbonate, titanium dioxide, zirconia, or a combination thereof.

The non-solvent curable composition may further include a polymerization inhibitor; malonic acid; 3-amino-1,2-propanediol; a silane-based coupling agent; a leveling agent; a fluorine-based surfactant; or a combination thereof.

The quantum dot in the non-solvent curable composition may be a quantum dot surface-modified with one or more of the compounds represented by Chemical Formula 1 to Chemical Formula 14.

According to another embodiment, a solvent-based curable composition includes the quantum dot surface-modified with one or more of the compounds represented by Chemical Formula 1 to Chemical Formula 14; a binder resin; and a solvent.

The solvent-based curable composition may further include a polymerizable monomer, a polymerization initiator, a light diffusing agent, or a combination thereof.

The solvent-based curable composition may be a photosensitive resin composition.

According to another embodiment, a cured layer manufactured utilizing the composition is provided.

According to another embodiment, a color filter including the cured layer is provided.

According to another embodiment, a method of manufacturing a cured layer includes applying the composition onto a substrate by an ink jet method to form a pattern; and curing the pattern.

The curing may be photocuring or thermal curing.

According to another embodiment, a method of manufacturing a cured layer includes applying the composition onto a substrate and exposing the same to form a pattern; developing the pattern; and heat-treating the pattern.

Other embodiments of the present disclosure are included in the following detailed description.

According to embodiments of the present disclosure, a quantum dot surface-modified with a specific ligand is provided, and the surface-modified quantum dot may be more easily applied to all of photocurable compositions, solvent-based thermosetting compositions, and non-solvent thermosetting compositions as compared to related art quantum dots, and thus may have improved viscosity and optical characteristics as well as processability.

DETAILED DESCRIPTION

Hereinafter, embodiments of the present disclosure are described in more detail. However, these embodiments are exemplary, the present disclosure is not limited thereto and the subject matter of the present disclosure is defined by the scope of claims and equivalents thereof.

As used herein, when specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C2 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when specific definition is not otherwise provided, the term "substituted" refers to replacement of at least one hydrogen atom by a substituent selected from a halogen atom (F, Cl, Br, or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, and a combination thereof.

As used herein, when specific definition is not otherwise provided, the term "hetero" refers to inclusion of at least one heteroatom selected from N, O, S, and P, in addition to carbon atom(s), in the chemical formula.

As used herein, when specific definition is not otherwise provided, the term "(meth)acrylate" refers to both "acrylate" and "methacrylate", and the term "(meth)acrylic acid" refers to both "acrylic acid" and "methacrylic acid".

As used herein, when specific definition is not otherwise provided, the term "combination" refers to mixing or copolymerization.

As used herein, when a definition is not otherwise provided, hydrogen is bonded at the position where a chemical bond is supposed to exist but not drawn in a chemical formula.

As used herein, a cardo-based resin refers to a resin including at least one functional group represented by one selected from Chemical Formula 16-1 to Chemical Formula 16-11 in the backbone of the resin.

In addition, in the present specification, when a definition is not otherwise provided, "*" refers to a linking point with the same or different atom or chemical formula.

A quantum dot according to an embodiment may be a quantum dot that is surface-modified with a ligand having a polar group, i.e., a ligand having high affinity to a polymerizable monomer having a carbon-carbon double bond at the terminal end. In the case of the above-described surface-modified quantum dots, it is easy (e.g., very easy) to produce high-concentration or highly-concentrated quantum dot dispersion (with improvement of dispersibility of quantum dots for monomers), thereby realizing a non-solvent curable composition and significantly (e.g., greatly) improving light efficiency.

For example, the ligand having the polar group may have a structure having a high affinity to a chemical structure of the monomer including the compound having the carbon-carbon double bond.

For example, the ligand having the polar group may be represented by one of Chemical Formula 1 to Chemical Formula 14, but the present disclosure is not necessarily limited thereto.

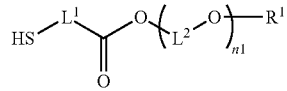

Chemical Formula 1

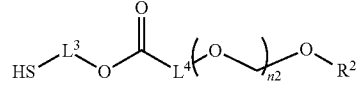

Chemical Formula 2

Chemical Formula 3

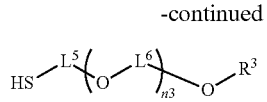

Chemical Formula 4

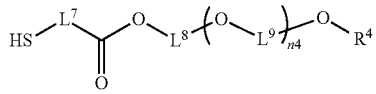

Chemical Formula 5

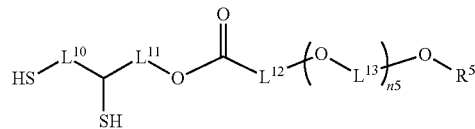

Chemical Formula 6

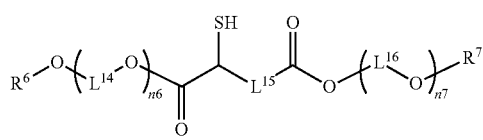

In Chemical Formula 1 to Chemical Formula 6,
$R^1$ to $R^7$ are each independently a substituted or unsubstituted C1 to C10 alkyl group or a substituted or unsubstituted C6 to C20 aryl group,
$L^1$ to $L^{16}$ are each independently a substituted or unsubstituted C1 to C10 alkylene group, and
n1 to n7 are each independently an integer of 0 to 10.

Chemical Formula 7

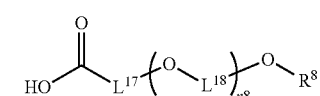

Chemical Formula 8

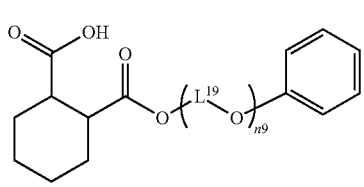

Chemical Formula 9

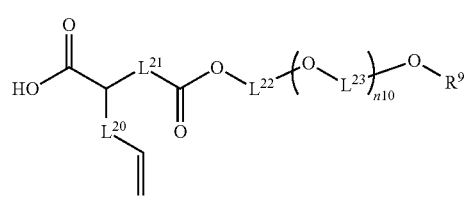

In Chemical Formula 7 to Chemical Formula 9,
$R^8$ and $R^9$ are each independently a substituted or unsubstituted C1 to C10 alkyl group,
$L^{17}$ to $L^{23}$ are each independently a substituted or unsubstituted C1 to C10 alkylene group, and
n8 to n10 are each independently an integer of 0 to 10.

Chemical Formula 10

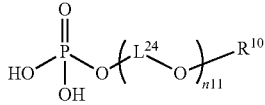

Chemical Formula 11

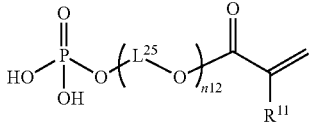

Chemical Formula 12

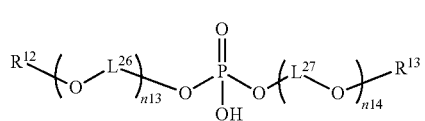

Chemical Formula 13

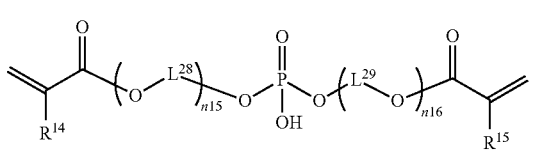

In Chemical Formula 10 to Chemical Formula 13,
$R^{10}$ to $R^{15}$ are each independently a hydrogen atom or a substituted or unsubstituted C1 to C10 alkyl group,
$L^{24}$ to $L^{29}$ are each independently a substituted or unsubstituted C1 to C10 alkylene group, and
n11 to n16 are each independently an integer of 0 to 10.

Chemical Formula 14

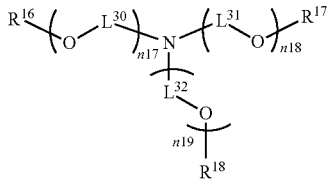

In Chemical Formula 14,
$R^{16}$ to $R^{18}$ are each independently a substituted or unsubstituted C1 to C10 alkyl group,
$L^{30}$ to $L^{32}$ are each independently a substituted or unsubstituted C1 to C10 alkylene group, and
n17 to n19 are each independently an integer of 0 to 10.

For example, the compound represented by Chemical Formula 1 to Chemical Formula 14 may be represented by one of Chemical Formula A to Chemical Formula P, but the present disclosure is not necessarily limited thereto.

Chemical Formula A

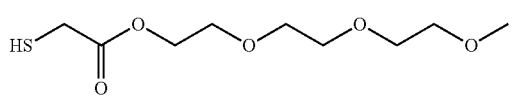

Chemical Formula B

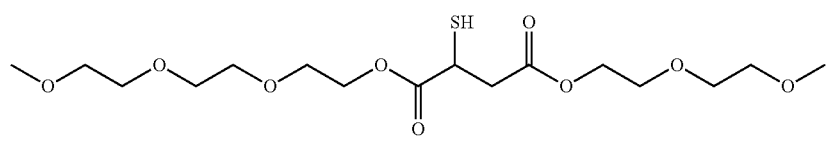

Chemical Formula C

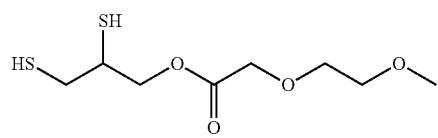

Chemical Formula D

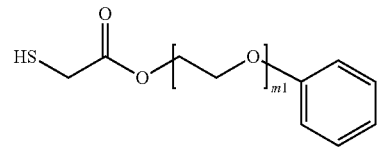

In Chemical Formula D, m1 is an integer of 0 to 10.

-continued

Chemical Formula N

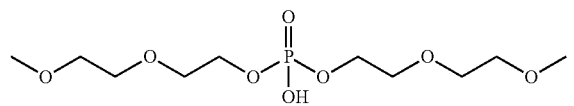

Chemical Formula E

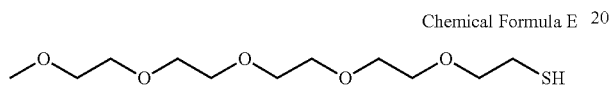

Chemical Formula F

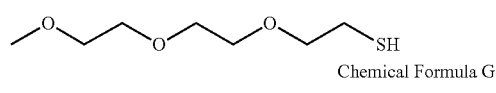

Chemical Formula O

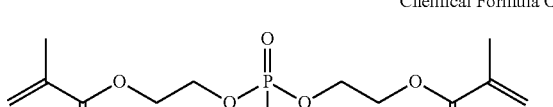

Chemical Formula G

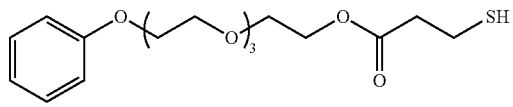

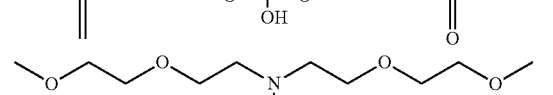

Chemical Formula H

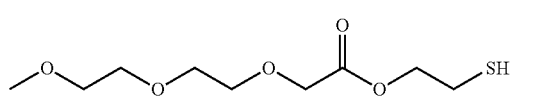

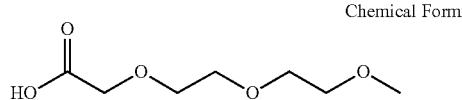

Chemical Formula I

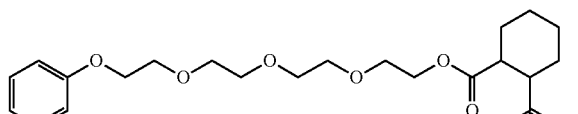

Chemical Formula J

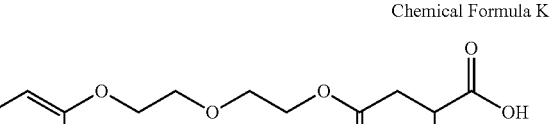

Chemical Formula K

Chemical Formula L

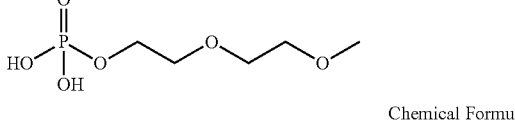

Chemical Formula M

In case that the ligand is utilized, it is easier to surface-modify the quantum dot. When the quantum dot surface-modified with the aforementioned ligand is added to the aforementioned monomers and is stirred, a transparent (e.g., very transparent) dispersion may be obtained, which is a measure to confirm that the quantum dot is well surface-modified.

For example, the quantum dot may have a maximum fluorescence emission wavelength at about 500 nm to about 680 nm.

A non-solvent curable composition according to another embodiment includes a quantum dot and a polymerizable monomer, wherein the monomer is included in an amount of about 40 wt % to about 80 wt % based on a total amount of the non-solvent curable composition.

An embodiment relates to a non-solvent curable composition including a quantum dot. In one embodiment, the quantum dot-containing curable composition (ink) has been developed to include (e.g., specifically utilize) a thiol binder or monomer (a resin for a quantum dot sheet (film) including 4T (e.g., monomer with four thiol groups)) that has good compatibility with the quantum dot.

On the other hand, because a generally and widely utilized polymerizable monomer, an -ene-based monomer (including a vinyl-based monomer, an acrylate-based monomer, a methacrylate-based monomer, and/or the like which includes a mono-functional monomer or a multi-functional monomer) has low compatibility with the quantum dot and is limited in terms of dispersibility of the quantum dot, various developments for usefully applying it to the quantum dot-containing curable composition are substantially difficult. In addition, the -ene-based monomer does not show high concentration quantum dot dispersibility and thus has difficulties in being applied to (e.g., included in) the quantum dot-containing curable composition.

Because of this drawback, the quantum dot-containing curable composition has been developed to have a composition including a solvent in a considerable amount (greater than or equal to about 50 wt %). But when the solvent content is increased, ink-jetting processability may be deteriorated. Accordingly, in order to satisfy the ink-jetting processability, a demand for a non-solvent curable composition is continuously increased.

An embodiment of the present disclosure relates to the increasing demand for the non-solvent curable composition, which may have an effect (e.g., a passivation effect) of not deteriorating inherent optical characteristics of the quantum dot as well as providing high concentration dispersibility of the quantum dots even in a solvent-free system (by including about 40 wt % to about 80 wt % of the polymerizable monomer including a compound having a carbon-carbon double bond at the terminal end along with the quantum dots based on a total weight of the curable composition) and thus improving affinity of the quantum dots to the curable composition.

Hereinafter, each component is specifically described in more detail.

Quantum Dot

The quantum dot included in the non-solvent curable composition may be a quantum dot surface-modified with one or more of the compounds represented by Chemical Formula 1 to Chemical Formula 14, but the present disclosure is not necessarily limited thereto.

For example, the quantum dot absorbs light in a wavelength region of about 360 nm to about 780 nm, for example, about 400 nm to about 780 nm, and emits fluorescence in a wavelength region of about 500 nm to about 700 nm, for example, about 500 nm to about 580 nm, or about 600 nm to about 680 nm. That is, the quantum dot may have a maximum fluorescence emission wavelength ($\lambda_{em}$) at about 500 nm to about 680 nm.

The quantum dots may each independently have a full width at half maximum (FWHM) of about 20 nm to about 100 nm, for example, about 20 nm to about 50 nm. When the quantum dot has a full width at half maximum (FWHM) of these ranges, color reproducibility is increased when utilized as a color material in a color filter due to high color purity.

The quantum dots may each independently be an organic material, an inorganic material, or a hybrid (mixture) of an organic material and an inorganic material.

The quantum dots may each independently include (e.g., be composed of) a core and a shell around (e.g., surrounding) the core, and the core and the shell may each independently have a structure of a core, core/shell, core/first shell/second shell, alloy, alloy/shell, and/or the like, each composed of Group II-IV elements, Group III-V elements, and/or the like, but embodiments are not limited thereto.

For example, the core may include at least one material selected from CdS, CdSe, CdTe, ZnS, ZnSe, ZnTe, HgS, HgSe, HgTe, GaN, GaP, GaAs, InP, InAs, and an alloy thereof, but the present disclosure is not necessarily limited thereto. The shell around (e.g., surrounding) the core may include at least one material selected from CdSe, ZnSe, ZnS, ZnTe, CdTe, PbS, TiO, SrSe, HgSe, and an alloy thereof, but the present disclosure is not necessarily limited thereto.

In an embodiment, because an interest in the environment has recently been much increased over the whole world, and a regulation of a toxic material has also been fortified (e.g., tightened), a non-cadmium-based light emitting material (InP/ZnS, InP/ZnSe/ZnS, etc.) having slightly lower (e.g., little low) quantum efficiency (quantum yield) but being environmentally-friendly (instead of a light emitting material having a cadmium-based core) is utilized, but the present disclosure is not necessarily limited thereto.

In the case of the quantum dots of the core/shell structure, an entire size including the shell (an average particle diameter) may be about 1 nm to about 15 nm, for example, about 5 nm to about 15 nm.

For example, the quantum dots may each independently be a red quantum dot, a green quantum dot, or a combination thereof. The red quantum dots may each independently have an average particle diameter of about 10 nm to about 15 nm. The green quantum dots may each independently have an average particle diameter of about 5 nm to about 8 nm.

Also, for dispersion stability of the quantum dots, the non-solvent curable composition according to an embodiment may further include a dispersing agent. The dispersing agent helps with the uniform dispersibility of a photo-conversion material such as a quantum dot in the non-solvent curable composition and may include a non-ionic, anionic, and/or cationic dispersing agent. For example, the dispersing agent may be polyalkylene glycol or esters thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine and/or the like, and may be utilized alone or in a mixture of two or more. The dispersing agent may be utilized in an amount of about 0.1 wt % to about 100 wt %, for example, about 10 wt % to about 20 wt %, relative to a solid content of the photo-conversion material such as quantum dots.

The quantum dots, for example, the surface-modified quantum dots may be included in an amount of about 1 wt % to about 40 wt %, for example, about 3 wt % to about 30 wt %, based on a total amount of the non-solvent curable composition. When the quantum dots, for example, the surface-modified quantum dots, are included within these ranges, a photo-conversion rate may be improved, and pattern characteristics and development characteristics may not be interfered with, so that the non-solvent curable composition may have suitable (e.g., excellent) processability.

Polymerizable Monomer Having Carbon-Carbon Double Bond at the Terminal End

The monomer having the carbon-carbon double bond at the terminal end may (e.g., should) be included in an amount of about 40 wt % to about 80 wt % based on a total amount of the non-solvent curable composition. For example, the monomer having the carbon-carbon double bond at the terminal end may be included in an amount of about 50 wt % to about 80 wt % based on a total amount of the non-solvent curable composition. When the monomer having the carbon-carbon double bond at the terminal end is included within these ranges, a non-solvent curable composition having a viscosity capable of (e.g., suitable for) ink-jetting may be prepared and the quantum dots in the prepared non-solvent curable composition may have improved dispersibility, thereby improving optical characteristics.

For example, the monomer having the carbon-carbon double bond at the terminal end may have a molecular weight of about 220 g/mol to about 1,000 g/mol. When the monomer having the carbon-carbon double bond at the terminal end has a molecular weight within this range, it may be suitable (e.g., advantageous) for ink-jetting because it does not increase the viscosity of the composition and does not hinder the optical characteristics of the quantum dot.

For example, the monomer having the carbon-carbon double bond at the terminal end may be represented by Chemical Formula 15, but the present disclosure is not necessarily limited thereto.

Chemical Formula 15

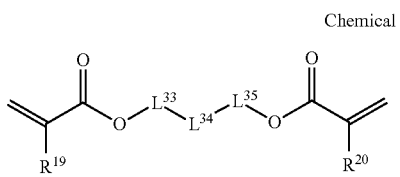

In Chemical Formula 15, $R^{19}$ and $R^{20}$ are each independently a hydrogen atom or a substituted or unsubstituted C1 to C10 alkyl group, $L^{33}$ and $L^{35}$ are each independently a substituted or unsubstituted C1 to C10 alkylene group, $L^{34}$ is a substituted or unsubstituted C1 to C10 alkylene group or an ether group (*—O—*).

For example, the monomer having the carbon-carbon double bond at the terminal end may be represented by Chemical Formula 15-1 or 15-2, but the present disclosure is not necessarily limited thereto.

Chemical Formula 15-1

Chemical Formula 15-2

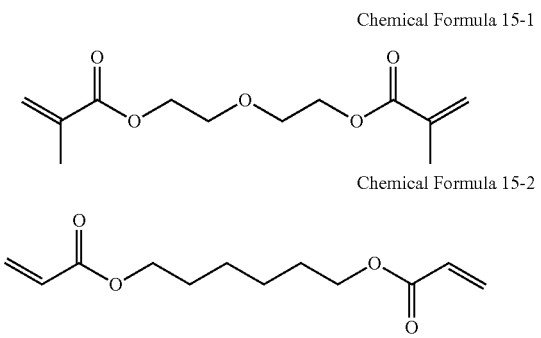

For example, the monomer having the carbon-carbon double bond at the terminal end may further include ethylene glycoldiacrylate, triethylene glycoldiacrylate, 1,4-butanedioldiacrylate, 1,6-hexanedioldiacrylate, neopentylglycoldiacrylate, pentaerythritoldiacrylate, pentaerythritoltriacrylate, dipentaerythritoldiacrylate, dipentaerythritoltriacrylate, dipentaerythritolpentaacrylate, pentaerythritolhexaacrylate, bisphenol A diacrylate, trimethylolpropanetriacrylate, novolacepoxyacrylate, ethylene glycoldimethacrylate, triethylene glycoldimethacrylate, propylene glycoldimethacrylate, 1,4-butanedioldimethacrylate, 1,6-hexanedioldimethacrylate, or a combination thereof in addition to the aforementioned compound of Chemical Formula 15-1 or Chemical Formula 15-2.

In addition, together with the monomer having the carbon-carbon double bond at the terminal end, a suitable (e.g., generally-utilized) monomer of a related art thermosetting or photocurable composition may be further included. For example, the monomer may further include an oxetane-based compound such as bis[1-ethyl (3-oxetanyl)]methyl ether, and/or the like.

Polymerization Initiator

A non-solvent curable composition according to an embodiment may further include a polymerization initiator, for example, a photopolymerization initiator, a thermal polymerization initiator, or a combination thereof.

The photopolymerization initiator is a suitable (e.g., generally-utilized) initiator for a photosensitive resin composition, for example, an acetophenone-based compound, a benzophenone-based compound, a thioxanthone-based compound, a benzoin-based compound, a triazine-based compound, an oxime-based compound, an aminoketone-based compound, and/or the like, but the present disclosure is not necessarily limited thereto.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and/or the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and/or the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and/or the like.

Examples of the benzoin-based compound may be benzoin, benzoin methyl ether, benzoin ethyl ether, benzoin isopropyl ether, benzoin isobutyl ether, benzyldimethylketal, and/or the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and/or the like.

Examples of the oxime-based compound may be O-acyloxime-based compound, 2-(O-benzoyloxime)-1[4-(phenylthio)phenyl]-1,2-octandione, 1-(O-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Non-limiting specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1, 2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and/or the like.

Examples of the aminoketone-based compound may be 2-benzyl-2-dimethylamino-1-(4-morpholinophenyl)-butan-1-one, and/or the like.

The photopolymerization initiator may further include a carbazole-based compound, a diketone-based compound, a sulfonium borate-based compound, a diazo-based compound, an imidazole-based compound, a biimidazole-based compound, and/or the like, besides the compounds described above.

The photopolymerization initiator may be utilized with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and/or the like.

Examples of the thermal polymerization initiator may be peroxide, such as benzoyl peroxide, dibenzoyl peroxide, lauryl peroxide, dilauryl peroxide, di-tert-butyl peroxide, cyclohexane peroxide, methyl ethyl ketone peroxide, hydroperoxide (e.g., tert-butyl hydroperoxide, cumene hydroperoxide), dicyclohexyl peroxydicarbonate, t-butyl peroxybenzoate, and/or the like; azo polymerization initiators, such as 2,2-azo-bis(isobutyronitrile), 2,2'-azobis-2-methylpropinonitrile, and/or the like, but the present disclosure is not necessarily limited thereto and any suitable thermal polymerization initiator (e.g., of which is well known in the art) may be utilized.

The polymerization initiator may be included in an amount of about 0.1 wt % to about 5 wt %, for example, about 1 wt % to about 4 wt %, based on a total amount of a non-solvent curable composition. When the polymerization initiator is included in these ranges, it is possible to obtain suitable (e.g., excellent) reliability due to sufficient curing (during exposure or thermal curing) and to reduce or prevent deterioration of transmittance (due to non-reaction initiators), thereby reducing or preventing deterioration of optical characteristics of the quantum dots.

Light Diffusing Agent (or Light Diffusing Agent Dispersion)

The non-solvent curable composition according to an embodiment may further include a light diffusing agent.

For example, the light diffusing agent may include barium sulfate ($BaSO_4$), calcium carbonate ($CaCO_3$), titanium dioxide ($TiO_2$), zirconia ($ZrO_2$), or a combination thereof.

The light diffusing agent may reflect unabsorbed light in the aforementioned quantum dots and allow the quantum dots to absorb the reflected light again. That is, the light diffusing agent may increase an amount of light absorbed by the quantum dots and increase photo-conversion efficiency of the curable composition.

The light diffusing agent may have an average particle diameter ($D_{50}$) of about 150 nm to about 250 nm, and for example, about 180 nm to about 230 nm. When the average particle diameter of the light diffusing agent is within these ranges, it may have a better light diffusing effect and increase photo-conversion efficiency.

The light diffusing agent may be included in an amount of about 1 wt % to about 20 wt %, for example, about 5 wt % to about 10 wt %, based on a total amount of a non-solvent curable composition. When the light diffusing agent is included in an amount of less than about 1 wt % based on a total amount of the non-solvent curable composition, it is difficult to expect a photo-conversion efficiency improvement effect due to the usage of the light diffusing agent, while when it is included in an amount of greater than about 20 wt %, there is a possibility that the quantum dots may be precipitated.

Other Additives

For stability and dispersion improvement of the quantum dots, the non-solvent curable composition according to an embodiment may further include a polymerization inhibitor.

The polymerization inhibitor may include a hydroquinone-based compound, a catechol-based compound, or a combination thereof, but the present disclosure is not necessarily limited thereto. When the non-solvent curable composition according to an embodiment further includes the hydroquinone-based compound, the catechol-based compound, or the combination thereof, room temperature crosslinking during exposure after coating the non-solvent curable composition may be prevented or inhibited.

For example, the hydroquinone-based compound, the catechol-based compound, or the combination thereof may be hydroquinone, methyl hydroquinone, methoxyhydroquinone, t-butyl hydroquinone, 2,5-di-t-butyl hydroquinone, 2,5-bis(1,1-dimethylbutyl) hydroquinone, 2,5-bis(1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O, O')aluminum, or a combination thereof, but the present disclosure is not necessarily limited thereto.

The hydroquinone-based compound, the catechol-based compound, or the combination thereof may be utilized in a form of dispersion. The polymerization inhibitor in a form of dispersion may be included in an amount of about 0.001 wt % to about 3 wt %, for example, about 0.1 wt % to about 2 wt %, based on a total amount of the non-solvent curable composition. When the polymerization inhibitor is included in these ranges, passage of time at room temperature may be solved and simultaneously sensitivity deterioration and surface delamination phenomenon may be reduced or prevented. That is, when the polymerization inhibitor is included in these ranges, the room temperature stability of the non-solvent curable composition may be improved, and reduction in curing sensitivity and delamination of the coating layer may both be reduced or prevented.

In addition, the non-solvent curable composition according to an embodiment may further include malonic acid; 3-amino-1,2-propanediol; a silane-based coupling agent; a leveling agent; a fluorine-based surfactant; or a combination thereof in order to improve heat resistance and reliability.

For example, the non-solvent curable composition according to an embodiment may further include a silane-based coupling agent having a reactive substituent such as a vinyl group, a carboxyl group, a methacryloxy group, an isocyanate group, an epoxy group and/or the like in order to improve close contacting (e.g., adhesion) properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-epoxycyclohexylethyltrimethoxysilane, and/or the like, and the silane-based coupling agent may be utilized alone or in a mixture of two or more.

The silane-based coupling agent may be utilized in an amount of about 0.01 parts by weight to about 10 parts by weight based on 100 parts by weight of the non-solvent curable composition. When the silane-based coupling agent is included within this range, close contacting (e.g., ahesion) properties, storage capability, and/or the like are suitable (e.g., excellent).

In addition, the non-solvent curable composition may further include a surfactant, for example, a fluorine-based surfactant, as needed in order to improve coating properties and inhibit generation of spots, that is, to improve leveling performance.

The fluorine-based surfactant may have a low weight average molecular weight of about 4,000 g/mol to about 10,000 g/mol, and for example, about 6,000 g/mol to about 10,000 g/mol. In addition, the fluorine-based surfactant may have a surface tension of 18 mN/m to 23 mN/m (measured in a 0.1% polyethylene glycol monomethylether acetate (PGMEA) solution). When the fluorine-based surfactant has a weight average molecular weight and a surface tension within the ranges described above, leveling performance may be further improved, and suitable (e.g., excellent) characteristics may be provided when slit coating as high speed coating is applied because less film defects may be generated by reducing or preventing a spot generation during the high speed coating and suppressing a vapor generation. That is, when the fluorine-based surfactant has a weight average molecular weight and a surface tension within the ranges described above, leveling performance may be further improved, and when coated utilizing high speed slit coating, spot generation and vapor generation may be reduced or prevented, thereby reducing film defects.

Examples of the fluorine-based surfactant may be, BM-1000®, and BM-1100® (BM Chemie Inc.); MEGAFACE F 142D®, F 172®, F 173®, and F 183® (Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON 5-145® (ASAHI Glass Co., Ltd.); and SH-28PA®, SH-190®, SH-193®, SZ-6032®, and SF-8428®, and the like (Toray Silicone Co., Ltd.); and F-482, F-484, F-478, F-554 and the like of DIC Co., Ltd.

In addition, the non-solvent curable composition according to an embodiment may include a silicone-based surfactant in addition to the fluorine-based surfactant. Specific examples of the silicone-based surfactant may be TSF400, TSF401, TSF410, TSF4440, and the like of Toshiba silicone Co., Ltd., but the present disclosure is not limited thereto.

The surfactant may be included in an amount of about 0.01 parts by weight to about 5 parts by weight, for example, about 0.1 parts by weight to about 2 parts by weight, based on 100 parts by weight of the non-solvent curable composition. When the surfactant is included within these ranges, less foreign materials are produced (or included) in a sprayed composition.

In addition, the non-solvent curable composition according to an embodiment may further include other additives such as an antioxidant, a stabilizer, and/or the like in a predetermined or set amount, unless desired properties are deteriorated (when these additives are included).

Another embodiment provides a solvent-based curable composition including the aforementioned quantum dot (surface-modified quantum dot), a binder resin, and a solvent.

Binder Resin

The binder resin may include an acryl-based resin, a cardo-based resin, an epoxy resin, or a combination thereof.

The acryl-based resin is a copolymer of a first ethylenic unsaturated monomer and a second ethylenic unsaturated monomer that are copolymerizable with each other, and may be a resin including at least one acryl-based repeating unit.

The first ethylenic unsaturated monomer is an ethylenic unsaturated monomer including at least one carboxyl group, and examples of the monomer include acrylic acid, methacrylic acid, maleic acid, itaconic acid, fumaric acid, and/or a combination thereof.

The first ethylenic unsaturated monomer may be included in an amount of about 5 wt % to about 50 wt %, for example, about 10 wt % to about 40 wt %, based on a total amount of the acryl-based binder resin.

The second ethylenic unsaturated monomer may be an aromatic vinyl compound (such as styrene, α-methylstyrene, vinyl toluene, vinylbenzylmethylether and/or the like); an unsaturated carboxylate ester compound (such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and/or the like); an unsaturated amino alkyl carboxylate ester compound (such as 2-aminoethyl (meth)acrylate, 2-dimethylaminoethyl(meth)acrylate, and/or the like); a carboxylic acid vinyl ester compound (such as vinyl acetate, vinyl benzoate, and/or the like); an unsaturated glycidyl carboxylate ester compound (such as glycidyl (meth)acrylate, and/or the like); a vinyl cyanide compound (such as (meth)acrylonitrile and/or the like); an unsaturated amide compound (such as (meth)acrylamide, and/or the like); and/or the like, and may be utilized alone or as a mixture of two or more.

Specific examples of the acryl-based binder resin may be a polybenzylmethacrylate, (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and/or the like, but the present disclosure is not limited thereto, and the acryl-based resin may be utilized alone or as a mixture of two or more.

A weight average molecular weight of the acryl-based binder resin may be about 5,000 g/mol to about 15,000 g/mol. When the acryl-based binder resin has a weight average molecular weight within this range, close contacting (e.g., adhesion) properties to a substrate, physical and chemical properties are improved, and a viscosity of the solvent-based curable composition is appropriate (e.g., suitable).

The cardo-based resin may include a repeating unit represented by Chemical Formula 16.

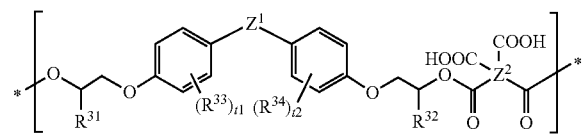

In Chemical Formula 16, $R^{31}$ and $R^{32}$ are each independently a hydrogen atom or a substituted or unsubstituted (meth)acryloyloxy alkyl group, $R^{33}$ and $R^{34}$ are each independently a hydrogen atom, a halogen atom, or a substituted or unsubstituted C1 to C20 alkyl group, $Z^1$ is a single bond, O, CO, $SO_2$, $CR^{35}R^{36}$, $SiR^{37}R^{38}$ (wherein, $R^{35}$ to $R^{38}$ are each independently a hydrogen atom or a substituted or unsubstituted C1 to C20 alkyl group), or one of linking groups represented by Chemical Formula 16-1 to Chemical Formula 16-11, Chemical Formula 16-1

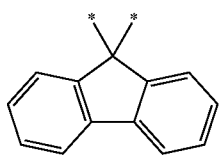

Chemical Formula 16-2

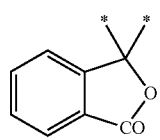

Chemical Formula 16-3

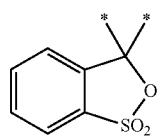

Chemical Formula 16-4

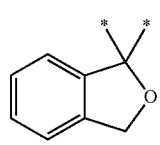

Chemical Formula 16-5

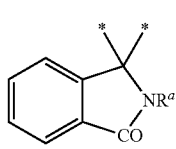

In Chemical Formula 16-5, $R^a$ is a hydrogen atom, an ethyl group, $C_2H_4Cl$, $C_2H_4OH$, $CH_2CH=CH_2$, or a phenyl group.

Chemical Formula 16-6

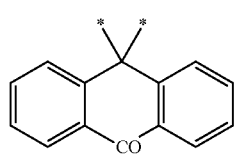

Chemical Formula 16-7

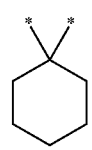

Chemical Formula 16-8

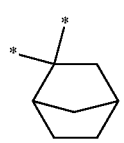

Chemical Formula 16-9

Chemical Formula 16-10

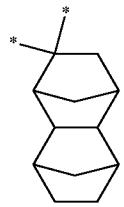

Chemical Formula 16-11

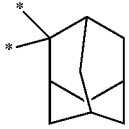

$Z^2$ is an acid anhydride residual group, and t1 and t2 are each independently an integer from 0 to 4.

A weight average molecular weight of the cardo-based binder resin may be about 500 g/mol to about 50,000 g/mol, for example, about 1,000 g/mol to about 30,000 g/mol. When the weight average molecular weight of the cardo-based binder resin is within these ranges, a satisfactory pattern may be formed without a residue during a manufacture of a cured layer (e.g., during the curing process of the coating layer) and without losing a film thickness during development of the solvent-based curable composition.

The cardo-based binder resin may include a functional group represented by Chemical Formula 17 at at least one terminal end of the two (i.e., both) terminal ends.

Chemical Formula 17

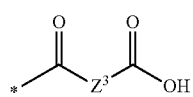

In Chemical Formula 17, $Z^3$ is represented by one of Chemical Formula 17-1 to Chemical Formula 17-7.

Chemical Formula 17-1

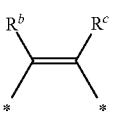

In Chemical Formula 17-1, $R^b$ and $R^c$ are each independently a hydrogen atom, a substituted or unsubstituted C1 to C20 alkyl group, an ester group, or an ether group.

Chemical Formula 17-2

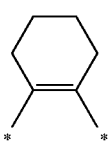

Chemical Formula 17-3

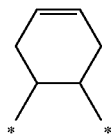

Chemical Formula 17-4

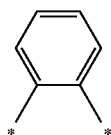

Chemical Formula 17-5

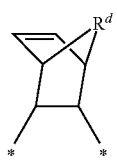

In Chemical Formula 17-5, Rd is O, S, NH, a substituted or unsubstituted C1 to C20 alkylene group, a C1 to C20 alkylamine group, or a C2 to C20 alkenylamine group.

Chemical Formula 17-6

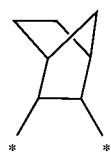

Chemical Formula 17-7

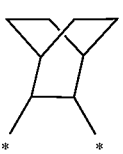

The cardo-based resin may be, for example, prepared by mixing at least two selected from a fluorene-containing compound (such as 9,9-bis(4-oxiranylmethoxyphenyl)fluorene); an anhydride compound (such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, and/or tetrahydrophthalic anhydride); a glycol compound (such as ethylene glycol, propylene glycol, and polyethylene glycol; an alcohol compound such as methanol, ethanol, propanol, n-butanol, cyclohexanol, and/or benzylalcohol); a solvent-based compound (such as propylene glycol methylethylacetate, and/or N-methylpyrrolidone); a phosphorus compound (such as triphenylphosphine); and an amine or ammonium salt compound (such as tetramethylammonium chloride, tetraethylammonium bromide, benzyldiethylamine, triethylamine, tributylamine, and/or benzyltriethylammonium chloride).

When the binder resin is a cardo-based resin, the solvent-based curable composition including the binder resin, for example (e.g., particularly), the photosensitive resin composition, may have suitable (e.g., excellent) developability and sensitivity during photo-curing and thus, may have suitable (e.g., fine) pattern-forming capability.

An acid value of the acryl-based resin may be about 80 mgKOH/g to about 130 mgKOH/g. When the acryl-based resin has an acid value within this range, suitable (e.g., excellent) resolution of a pixel may be obtained.

The epoxy resin may be a thermally polymerizable monomer or oligomer, and may include a compound having a carbon-carbon unsaturated bond and a carbon-carbon cyclic bond.

The epoxy resin may further include a bisphenol A epoxy resin, a bisphenol F epoxy resin, a phenol novolac epoxy resin, a cyclic aliphatic epoxy resin, and/or an aliphatic polyglycidyl ether, but the present disclosure is not necessarily limited thereto.

Suitable commercially available product of the compound (e.g., epoxy resin) may be a bisphenyl epoxy resin (such as YX4000, YX4000H, YL6121H, YL6640, or YL6677 of Yuka Shell Epoxy Co.); a cresol novolac epoxy resin (such as EOCN-102, EOCN-1035, EOCN-1045, EOCN-1020, EOCN-1025, and EOCN-1027 of Nippon Kayaku Co. Ltd. and EPIKOTE 180S75, and the like of Yuka Shell Epoxy Co.); a bisphenol A epoxy resin (such as EPIKOTE 1001, 1002, 1003, 1004, 1007, 1009, 1010 and 828 of Yuka Shell Epoxy Co.); a bisphenol F epoxy resin (such as EPIKOTE 807 and 834 of Yuka Shell Epoxy Co.); a phenol novolac epoxy resin (such as EPIKOTE 152, 154, or 157H65 of Yuka Shell Epoxy Co. and EPPN 201, 202 of Nippon Kayaku Co. Ltd. and EPPN 201, 202 of Nippon Kayaku Co. Ltd.); a cyclic aliphatic epoxy resin (such as CY175, CY177 and CY179 of CIBA-GEIGY A.G Corp., ERL-4234, ERL-4299, ERL-4221 and ERL-4206 of U.C.C., Showdyne 509 of Showa Denko K.K., Araldite CY-182 of CIBA-GEIGY A.G Corp., CY-192 and CY-184, Dainippon Ink & Chemicals Inc., EPICLON 200 and 400, EPIKOTE 871, 872 of Yuka Shell Epoxy Co. and EP1032H60, ED-5661 and ED-5662 of Celanese Coating Corporation); an aliphatic polyglycidylether (such as EPIKOTE 190P and 191P of Yuka Shell Epoxy Co., EPOLITE 100MF of Kyoeisha Yushi Kagaku Kogyo Co., Ltd., EPIOL TMP of Nihon Yushi K. K.), and/or the like.

Solvent

The solvent may include, for example, alcohols (such as methanol, ethanol, and/or the like); glycol ethers (such as ethylene glycol methylether, ethylene glycol ethylether, propylene glycol methylether, and/or the like); cellosolve acetates (such as methyl cellosolve acetate, ethyl cellosolve acetate, diethyl cellosolve acetate, and/or the like); carbitols (such as methylethyl carbitol, diethyl carbitol, diethylene glycol monomethylether, diethylene glycol monoethylether, diethylene glycol dimethylether, diethylene glycol methylethylether, diethylene glycol diethylether, and/or the like); propylene glycol alkylether acetates (such as propylene glycol monomethylether acetate, propylene glycol propylether acetate, and/or the like); ketones (such as methylethylketone, cyclohexanone, 4-hydroxy-4-methyl-2-pentanone, methyl-n-propylketone, methyl-n-butylketone, methyl-n-amylketone, 2-heptanone, and/or the like); saturated aliphatic monocarboxylic acid alkyl esters (such as ethyl acetate, n-butyl acetate, isobutyl acetate, and/or the like); lactate esters (such as methyl lactate, ethyl lactate, and/or the like); hydroxy acetic acid alkyl esters (such as methyl hydroxyacetate, ethyl hydroxyacetate, butyl hydroxyacetate, and/or the like); acetic acid alkoxyalkyl esters (such as methoxymethyl acetate, methoxyethyl acetate, methoxybutyl acetate, ethoxymethyl acetate, ethoxyethyl acetate, and/or the like); 3-hydroxypropionic acid alkyl esters (such as methyl 3-hydroxypropionate, ethyl 3-hydroxypropionate, and/or the like); 3-alkoxypropionic acid alkyl esters (such as methyl 3-methoxypropionate, ethyl 3-methoxypropionate, ethyl 3-ethoxypropionate, methyl 3-ethoxypropionate, and/or the like); 2-hydroxypropionic acid alkyl ester (such as methyl 2-hydroxypropionate, ethyl 2-hydroxypropionate, propyl 2-hydroxypropionate, and/or the like); 2-alkoxypropionic acid alkyl esters (such as methyl 2-methoxypropionate, ethyl 2-methoxypropionate, ethyl 2-ethoxypropionate, methyl 2-ethoxypropionate, and/or the like); 2-hydroxy-2-methylpropionic acid alkyl esters (such as methyl 2-hydroxy-2-methylpropionate, ethyl 2-hydroxy-2-methylpropionate, and/or the like); 2-alkoxy-2-methylpropionic acid alkyl esters (such as methyl 2-methoxy-2-methylpropionate, ethyl 2-ethoxy-2-methylpropionate, and/or the like); esters (such as 2-hydroxyethyl propionate, 2-hydroxy-2-methylethyl propionate, hydroxyethyl acetate, methyl 2-hydroxy-3-methylbutanoate, and/or the like); and/or ketonate esters (such as ethyl pyruvate, and/or the like), and in addition, may include N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and/or the like, but the present disclosure is not limited thereto.

For example, the solvent may be desirably glycol ethers (such as ethylene glycol monoethylether, ethylene diglycolmethylethylether, and/or the like); ethylene glycol alkylether acetates (such as ethyl cellosolve acetate, and/or the like); esters (such as 2-hydroxy ethyl propionate, and/or the like); carbitols (such as diethylene glycol monomethylether, and/or the like); propylene glycol alkylether acetates (such as propylene glycol monomethylether acetate, propylene glycol propylether acetate, and/or the like); alcohols (such as ethanol, and/or the like), or a combination thereof.

For example, the solvent may be a polar solvent including propylene glycol monomethylether acetate, dipropylene glycol methylether acetate, ethanol, ethylene glycoldimethylether, ethylenediglycolmethylethylether, diethylene glycoldimethylether, 2-butoxyethanol, N-methylpyrrolidine, N-ethylpyrrolidine, propylene carbonate, γ-butyrolactone, or a combination thereof.

The solvent may be included in an amount of about 20 wt % to about 80 wt %, for example, about 35 wt % to about 80 wt %, based on a total amount of the solvent-based curable composition. When the solvent is within these range, the solvent-based curable composition has appropriate viscosity and thus may have suitable (e.g., excellent) coating property when coated in a large area through spin-coating and/or slit-coating.

In one embodiment, the solvent-based curable composition may further include at least one of a monomer having a carbon-carbon double bond at the terminal end, a polymerization initiator, a diffusing agent, and other additives.

For example, the solvent-based curable composition may be a photosensitive resin composition. In this case, the solvent-based curable composition may include a photopolymerization initiator as the polymerization initiator.

Another embodiment provides a cured layer manufactured utilizing the aforementioned non-solvent curable composition and/or solvent-based curable composition, a color filter including the cured layer, and a display device including the color filter.

One of the methods of manufacturing the cured layer may include coating the aforementioned non-solvent curable composition and/or solvent-based curable composition on a substrate utilizing an ink-jet spraying method to form a pattern (S1); and curing the pattern (S2).

(S1) Formation of Pattern

The non-solvent curable composition may desirably be coated to be about 0.5 μm to about 20 μm in thickness on a substrate in an ink-jet spraying method. The ink-jet spraying method may form a pattern by spraying a single color per each nozzle and thus repeating the spraying as many times as the number of colors needed, but the pattern may be formed by concurrently or simultaneously spraying the number of colors needed through each ink-jet nozzle in order to reduce the number of processes. That is, the pattern may be formed by concurrently spraying the number of colors needed through a plurality of nozzles (e.g., each containing one of the colors).

(S2) Curing

The obtained pattern is cured to obtain a pixel. Herein, the curing method may be thermal curing and/or photocuring process. The thermal curing process may be performed at greater than or equal to about 100° C., desirably, in a range of about 100° C. to about 300° C., and more desirably, in a range of about 160° C. to about 250° C. The photocuring process may include irradiating an actinic ray such as a UV ray of about 190 nm to about 450 nm, for example, about 200 nm to about 500 nm. The irradiating is performed by utilizing a light source such as a mercury lamp (with a low pressure, a high pressure, or an ultrahigh pressure), a metal halide lamp, an argon gas laser, and/or the like. An X ray, an electron beam, and/or the like may also be utilized as needed.

The other method of manufacturing the cured layer may include manufacturing a cured layer utilizing the aforementioned non-solvent curable composition and/or solvent-based curable composition by a lithographic method as follows.

(1) Coating and Film Formation

The aforementioned curable resin composition is coated to have a desired thickness, for example, a thickness from about 2 μm to about 10 μm, on a substrate (which has undergone a set or predetermined pretreatment), utilizing a spin coating method, a slit coating method, a roll coating method, a screen-printing method, an applicator method, and/or the like. Then, the coated substrate is heated at a temperature of about 70° C. to about 90° C. for 1 minute to 10 minutes to remove a solvent and to form a film.

(2) Exposure

The resultant film is irradiated by an actinic ray such as a UV ray of about 190 nm to about 450 nm, for example, about 200 nm to about 500 nm, through a mask with a set or predetermined shape to form a desired pattern. The irradiation is performed by utilizing a light source such as a mercury lamp (with a low pressure, a high pressure, or an ultrahigh pressure), a metal halide lamp, an argon gas laser, and/or the like. An X ray, an electron beam, and/or the like may also be utilized as needed.

Exposure process utilizes, for example, a light dose of 500 mJ/cm$^2$ or less (with a 365 nm sensor) when a high pressure mercury lamp is utilized. However, the light dose may vary depending on kinds of each component of the curable composition, their combination ratio, and/or a dry film thickness.

(3) Development

After the exposure process, an alkali aqueous solution is utilized to develop the exposed film by dissolving and removing an unnecessary part except the exposed part, thereby forming an image pattern. In other words, when the alkali developing solution is utilized for the development, a non-exposed region is dissolved, and an image color filter pattern is formed.

(4) Post-Treatment

The developed image pattern may be heated again or irradiated by an actinic ray and/or the like for curing, in order to accomplish suitable (e.g., excellent) quality in terms of heat resistance, light resistance, close contacting (e.g., adhesion) properties, crack-resistance, chemical resistance, high strength, storage stability, and/or the like.

Hereinafter, the subject matter of the present disclosure is illustrated in more detail with reference to examples. These examples, however, are not in any sense to be interpreted as limiting the scope of the disclosure.

(Preparation of Surface-Modified Quantum Dot Dispersion)
(Synthesis Method of Chemical Formula A)

50 g of thioglycolic acid, 91 g of 2-[2-(2-methoxyethoxy)ethoxy]-ethanol, and 10.27 g of p-toluenesulfonic acid monohydrate were put in a flask and then, evenly dispersed in 500 mL of cyclohexane under a nitrogen atmosphere. An injection hole of the flask was connected to a dean stark, and a condenser was connected thereto. The reaction flask was stirred for a set or predetermined time, while heated at 80° C., and then, whether or not water has been gathered inside the dean stark was examined. After confirming that water has gathered, the stirring was additionally performed for 12 hours. When 0.54 mol of the water has come out, the reaction was completed. Ethyl acetate and an excessive amount of water were added to the reactants for extraction and neutralization, a vacuum evaporator was utilized for concentration, and then, a final product (i.e., the ligand represented by Chemical Formula A) therefrom was dried in a vacuum oven.

Preparation Example 1

A magnetic bar was put in a 3-neck round-bottomed round flask, and a quantum dot-CHA (cyclohexyl acetate) solution (solid content: 26 wt % to 27 wt %) was weighed and added thereto. The ligand represented by Chemical Formula A was added thereto.

The mixture was well mixed for 1 minute and then, stirred at 80° C. under a nitrogen atmosphere. When the reaction was completed, the resultant was cooled down to room temperature, and added to cyclohexane to get precipitates. The precipitated quantum dot powder was separated from the cyclohexane through centrifugation. A clear solution was poured out and discarded, and then, the precipitates were sufficiently dried in a vacuum oven for one day to obtain surface-modified quantum dots.

The surface-modified quantum dots were stirred (e.g., mixed by stirring) with a monomer represented by Chemical Formula 15-1 (triethylene glycol dimethacrylate, Miwon Commercial Co., Ltd.) for 12 hours to obtain surface-modified quantum dot dispersion.

Chemical Formula A

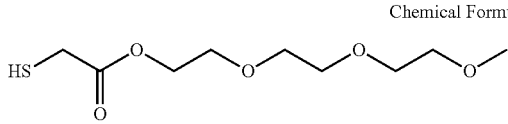

Chemical Formula 15-1

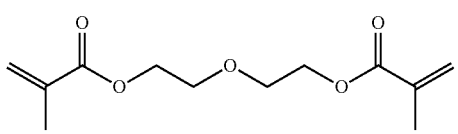

(Synthesis Method of Chemical Formula E)

79 g of p-toluenesulfonic chloride and 150 mL of THF dispersion were slowly injected to a mixed solution of 100 g of pentaethylene glycol monomethyl ether, 14.3 g of NaOH, 500 mL of THF, and 100 mL of $H_2O$ at 0° C. After 30 minutes, the injection is completed, the obtained mixture was stirred for about 12 hours. When the reaction was completed, the resultant was purified through extraction, neutralization, and concentration and then, sufficiently dried in a vacuum oven. The obtained product was put in a flask and dissolved in ethanol under a nitrogen atmosphere. 3 to 5 equivalents of thiourea was added thereto and then, stirred at 100° C. for 12 hours. 20 equivalents of a NaOH diluent was injected into the reactants and then, further stirred for 5 hours. When the reaction was completed, the resultant was washed several times, extracted, and neutralized with water and a hydrochloric acid diluent and then, concentrated and sufficiently dried in a vacuum oven to obtain the product (i.e., the ligand represented by Chemical Formula E).

Preparation Example 2

Surface-modified quantum dot dispersion was obtained according to the same method as Preparation Example 1 except that a ligand represented by Chemical Formula E was utilized instead of the ligand represented by Chemical Formula A.

Chemical Formula E

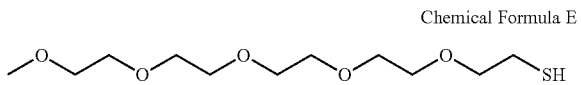 [SMILES: COCCOCCOCCOCCOCCS]

(Synthesis Method of Chemical Formula K)

260 g of PH-4 (Hannon Chemicals Inc.) and 140 g of allylsuccinic anhydride were stirred at 80° C. for 20 hours to thereby manufacture the ligand represented by Chemical Formula K.

Preparation Example 3

Surface-modified quantum dot dispersion was obtained according to the same method as Preparation Example 1 except that a ligand represented by Chemical Formula K was utilized instead of the ligand represented by Chemical Formula A.

Chemical Formula K

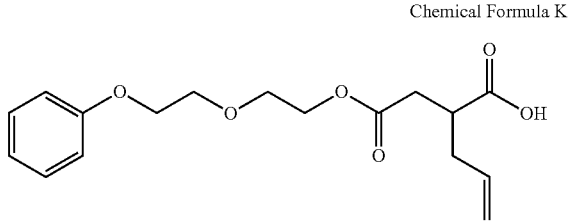 [SMILES: C=CCC(CC(=O)OCCOCCOc1ccccc1)C(=O)O]

Preparation Example 4

Surface-modified quantum dot dispersion was obtained according to the same method as Preparation Example 1 except that the monomer represented by Chemical Formula 15-3 (butyl dimethacrylate, Hannon Chemicals Inc.) was utilized instead of the monomer represented by Chemical Formula 15-1.

Chemical Formula 15-3

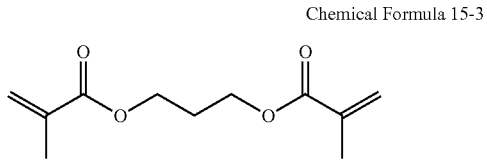

Comparative Preparation Example 1

Surface-modified quantum dot dispersion was obtained according to the same method as Preparation Example 1 except that a monomer having no carbon-carbon double bond at the terminal end, OXT 221 (Toagosei Co., Ltd.) was utilized instead of the monomer represented by Chemical Formula 15-1.

Evaluation 1: Dispersibility

The particle size of each quantum dot dispersion according to Preparation Examples 1 to 4 and Comparative Preparation Example 1 was measured three times by utilizing a micro particle size analyzer to obtain an average particle size, and the results are shown in Table 1.

TABLE 1

| Particle size (nm) | Preparation Example 1 | Preparation Example 2 | Preparation Example 3 | Preparation Example 4 | Comparative Preparation Example 1 |
|---|---|---|---|---|---|
| D50 | 12.4 | 12.5 | 12.2 | 12.8 | 21.1 |
| D90 | 36.6 | 38 | 24.6 | 28.9 | 48.2 |

Referring to Table 1, each of the quantum dot dispersion according to Preparation Examples 1 to 4 exhibited a narrow particle size distribution, which shows that the quantum dots were well dispersed in a high boiling-point and high surface-tension solvent (e.g., monomer), but the quantum dot dispersion according to Comparative Preparation Example 1 exhibited a wide particle size distribution, which shows that the quantum dots were not well dispersed in the high boiling-point and high surface-tension solvent (e.g., monomer).

(Preparation of Non-Solvent Curable Composition)

Example 1

The dispersion according to Preparation Example 1 was weighed and then, mixed and diluted with the monomer represented by Chemical Formula 15-1, and a polymerization inhibitor (methylhydroquinone, Tokyo Chemical Industry Co., Ltd.; 5 wt %) was added thereto and then, stirred for 5 minutes. Subsequently, a photoinitiator (TPO-L, Polynetron) was injected thereinto, and a light diffusing agent ($TiO_2$; SDT89, Iridos Co., Ltd.) was added thereto. The entire dispersion was stirred for 1 hour to prepare a non-solvent curable composition. 8 wt % of the quantum dots, 80 wt % of the monomer represented by Chemical Formula 15-1, 1 wt % of the polymerization inhibitor, 3 wt % of the photoinitiator, and 8 wt % of the light diffusing agent were included based on a total amount of the non-solvent curable composition.

Example 2

A non-solvent curable composition was prepared according to the same method as Example 1 except that the dispersion according to Preparation Example 2 was utilized instead of the dispersion according to Preparation Example 1.

Example 3

A non-solvent curable composition was prepared according to the same method as Example 1 except that the dispersion according to Preparation Example 3 was utilized instead of the dispersion according to Preparation Example 1.

Example 4

A non-solvent curable composition was prepared according to the same method as Example 1 except that the dispersion according to Preparation Example 4 instead of the dispersion according to Preparation Example 1 and a monomer represented by Chemical Formula 15-3 instead of the monomer represented by Chemical Formula 15-1 were utilized.

Example 5

A non-solvent curable composition was prepared according to the same method as Example 2 except that 48 wt % of the quantum dots, 40 wt % of the monomer represented by Chemical Formula 15-1, 1 wt % of the polymerization inhibitor, 3 wt % of the photoinitiator, and 8 wt % of the light diffusing agent were utilized based on a total amount of the non-solvent curable composition.

Comparative Example 1

A non-solvent curable composition was prepared according to the same method as Example 1 except that the dispersion of Comparative Preparation Example 1 instead of the dispersion of Preparation Example 1 and a monomer having no carbon-carbon double bond at the terminal end, OXT 221 (Toagosei Co., Ltd.) instead of the monomer represented by Chemical Formula 15-1 were utilized.

Comparative Example 2

A non-solvent curable composition was prepared according to the same method as Example 2 except that 50 wt % of the quantum dots, 38 wt % of the monomer represented by Chemical Formula 15-1, 1 wt % of the polymerization inhibitor, 3 wt % of the photoinitiator, and 8 wt % of the light diffusing agent were utilized based on a total amount of the non-solvent curable composition.

Comparative Example 3

A non-solvent curable composition was prepared according to the same method as Example 2 except that 6 wt % of the quantum dots, 82 wt % of the monomer represented by Chemical Formula 15-1, 1 wt % of the polymerization inhibitor, 3 wt % of the photoinitiator, and 8 wt % of the light diffusing agent were utilized based on a total amount of the non-solvent curable composition.

Evaluation 2: Evaluation of Optical Characteristics

Each composition according to Examples 1 to 5 and Comparative Examples 1 to 3 was coated to be about 15 μm thick on glass substrates (G-1, G-2) or yellow photoresists (YPR) (Y-1, Y-2) with a spin coater (800 rpm, 5 seconds, Opticoat MS-A150, Mikasa Co., Ltd.) and exposed with 5000 mJ/cm$^2$ (83° C., 10 seconds) with a 395 nm UV exposer under a nitrogen atmosphere to prepare a cured film. Subsequently, a 2 cm×2 cm single film specimen of each cured film was loaded in an integrating sphere equipment (QE-2100, Otsuka Electronics, Co., Ltd.) and measured with respect to a light absorption rate and light efficiency, and the results are shown in Tables 2 to 9.

TABLE 2

Exposure (5 J/cm$^2$, N$_2$)

| Example 1 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 19.5 | 16.8 | 538.5 | 34.4 | 15.38 |
| G-2 | 19.6 | 16.9 | 538.4 | 34.5 | 15.41 |
| Y-1 | 100 | 9.7 | 538.5 | 34.5 | 15.38 |
| Y-2 | 100 | 9.8 | 538.4 | 34.5 | 15.41 |

TABLE 3

Exposure (5 J/cm$^2$, N$_2$)

| Example 2 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 20.5 | 18.8 | 538.2 | 34.4 | 15.2 |
| G-2 | 20.4 | 18.7 | 538.2 | 34.4 | 15.3 |
| Y-1 | 100 | 10.2 | 538.1 | 34.5 | 15.2 |
| Y-2 | 100 | 10.2 | 538.2 | 34.5 | 15.3 |

TABLE 4

Exposure (5 J/cm$^2$, N$_2$)

| Example 3 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 20.3 | 18.7 | 538.3 | 34.5 | 15.7 |
| G-2 | 20.4 | 18.8 | 538.2 | 34.5 | 15.6 |
| Y-1 | 100 | 10.1 | 538.5 | 34.5 | 15.7 |
| Y-2 | 100 | 10.1 | 538.4 | 34.5 | 15.6 |

TABLE 5

Exposure (5 J/cm$^2$, N$_2$)

| Example 4 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 19.7 | 18.5 | 539.3 | 34.4 | 15.2 |
| G-2 | 19.9 | 18.5 | 539.4 | 34.5 | 15.2 |
| Y-1 | 100 | 9.9 | 539.3 | 34.5 | 15.2 |
| Y-2 | 100 | 9.9 | 539.4 | 34.6 | 15.2 |

TABLE 6

Exposure (5 J/cm$^2$, N$_2$)

| Example 5 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 97.5 | 35.5 | 542.5 | 35.1 | 15.4 |
| G-2 | 97.6 | 35.4 | 542.3 | 35.2 | 15.3 |
| Y-1 | 100 | 33.0 | 542.1 | 35.1 | 15.4 |
| Y-2 | 100 | 33.1 | 542.2 | 35.2 | 15.3 |

TABLE 7

Exposure (5 J/cm$^2$, N$_2$)

| Comparative Example 1 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 15.3 | 7.2 | 538.1 | 34.4 | 15.1 |
| G-2 | 15.5 | 7.4 | 538.2 | 34.3 | 15.3 |
| Y-1 | 100 | 3.8 | 538.1 | 34.3 | 15.1 |
| Y-2 | 100 | 3.9 | 538.2 | 34.4 | 15.3 |

TABLE 8

Exposure (5 J/cm$^2$, N$_2$)

| Comparative Example 2 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 94.3 | 31.3 | 540.8 | 34.5 | 15.5 |
| G-2 | 94.2 | 31.5 | 540.9 | 34.4 | 15.4 |
| Y-1 | 100 | 27.5 | 540.8 | 34.5 | 15.5 |
| Y-2 | 100 | 27.4 | 540.9 | 34.4 | 15.4 |

TABLE 9

Exposure (5 J/cm$^2$, N$_2$)

| Comparative Example 3 (Green) | Light absorption rate (%) | External quantum efficiency (E.Q.E) (%) | Maximum emission wavelength (nm) | Full width at half maximum (FWHM) | Thickness (µm) |
|---|---|---|---|---|---|
| G-1 | 15.5% | 7.8 | 539.8 | 34.3 | 15.3 |
| G-2 | 15.6% | 7.6 | 539.8 | 34.4 | 15.3 |
| Y-1 | 100 | 3.3 | 539.9 | 34.3 | 15.3 |
| Y-2 | 100 | 3.5 | 539.9 | 34.3 | 15.3 |

Evaluation 3: Discharge Rate of Non-solvent curable composition Depending on Latency Time Each non-solvent curable composition according to Examples 1 to 5 and Comparative Examples 1 to 3 was evaluated with respect to a discharge rate depending on (e.g., as a function of) latency time in the following method, and the results are shown in Table 10.

The non-solvent curable compositions were respectively jetted through 100 nozzles on an ink-jet equipment on pixels of a substrate and then, the jetting was stopped and the nozzles were maintained as they were. Subsequently, when the non-solvent curable compositions were jetted by a set or predetermined time (latency time) unit, the number of nozzles not clogged but capable of well discharging the non-solvent curable compositions was counted. That is, after a set or predetermined time (latency time) unit has passed since the time the initial jetting of the non-solvent curable compositions was stopped, the number of nozzles that remain unclogged was counted.

TABLE 10

(unit: number)

| | Time (Latency time) (hrs.) | | | | | | | | |
|---|---|---|---|---|---|---|---|---|---|
| | 0 | 2 | 4 | 8 | 12 | 16 | 20 | 24 | 28 |
| Example 1 | 100 | 100 | 100 | 100 | 100 | 100 | 100 | 100 | 90 |
| Example 2 | 100 | 100 | 100 | 100 | 100 | 100 | 100 | 100 | 99 |
| Example 3 | 100 | 100 | 100 | 100 | 100 | 100 | 100 | 100 | 95 |
| Example 4 | 100 | 100 | 100 | 100 | 100 | 100 | 100 | 100 | 92 |
| Example 5 | 100 | 100 | 100 | 100 | 100 | 100 | 100 | 100 | 97 |
| Comparative Example 1 | 100 | 100 | 100 | 90 | 80 | 75 | 35 | 0 | 0 |
| Comparative Example 2 | 100 | 100 | 100 | 95 | 87 | 80 | 38 | 5 | 0 |
| Comparative Example 3 | 100 | 100 | 100 | 93 | 85 | 78 | 30 | 0 | 0 |

Evaluation 4: Room Temperature (25° C.) Storage Stability of Non-solvent Curable Composition The non-solvent curable compositions according to Examples 1 to 5 and Comparative Examples 1 to 3 were evaluated with respect to room temperature storage stability depending on latency time by calculating a viscosity difference from initial viscosity after time went (e.g., as a function of time), and the results are shown in Table 11. That is, the room temperature storage stability is indicated by the change in viscosity from the initial viscosity as a function of storage time.

The viscosities were measured by utilizing a viscosity meter (RheoStress 6000, HAAKE Technik GmbH) at room temperature at 100 rpm for 2 minutes.

TABLE 11

(unit: cPs)

| | Time (weeks) | | | | |
|---|---|---|---|---|---|
| | 0 | 1 week | 2 weeks | 3 weeks | 4 weeks |
| Example 1 | 10.1 | 10.2 | 10.1 | 10.3 | 10.4 |
| Example 2 | 11.5 | 11.4 | 11.5 | 11.4 | 11.5 |
| Example 3 | 11.7 | 11.7 | 11.6 | 11.8 | 11.8 |
| Example 4 | 11.9 | 11.9 | 11.8 | 11.9 | 11.9 |
| Example 5 | 24.3 | 24.4 | 24.4 | 24.5 | 24.5 |
| Comparative Example 1 | 10.3 | 11.5 | 12.1 | 12.5 | 13.2 |
| Comparative Example 2 | 28.5 | 28.6 | 28.7 | 28.9 | 29.1 |
| Comparative Example 3 | 10.8 | 11.3 | 12.6 | 13.0 | 14.5 |

Referring to Evaluations 1 to 4, the non-solvent curable composition according to an embodiment had appropriately-adjusted viscosity for ink-jetting as well as exhibited suitable (e.g., very excellent) optical characteristics. Furthermore, storage stability was also suitable (e.g., excellent) at room temperature.

Preparation of Solvent-Based Curable Composition

Example 6

The dispersion according to Preparation Example 1 was weighed to disperse quantum dots (23 wt %) in dimethyl adipate (45 wt %) and mixed with a cardo-based binder resin (TSR-TA01, TAKOMA) (8 wt %) to prepare a quantum dot dispersion. Subsequently, OXT-221 (Toagosei Co., Ltd.) (1 wt %) and PFM-02 (SMS) (16.5 wt %) as a thermosetting monomer, a light diffusing agent (TiO$_2$; SDT89, Iridos Co., Ltd.) (2 wt %), glycol di-3-mercaptopropionate (Bruno Bock Chemische Fabrik GMBH & CO., KG) (4.2 wt %), and methyl hydroquinone (TCI) (0.3 wt %) as a polymerization inhibitor were mixed, and the quantum dot dispersion was added thereto and then, stirred to prepare a solvent-based curable composition.

Example 7

A solvent-based curable composition (photosensitive resin composition) was prepared utilizing the following components in the corresponding amount.
1) Quantum dot: 12 wt % of quantum dots obtained from Preparation Example 1
2) Binder resin: 25 wt % of a cardo-based binder resin (TSR-TA01, TAKOMA)
3) Polymerizable monomer: 5.4 wt % of pentaerythritol-hexamethacrylate (DPHA, Nippon Kayaku Co. Ltd.)
4) Photopolymerization initiator: 0.7 wt % of diphenyl(2,4,6-trimethylbenzoyl)phosphine oxide (TPO, Sigma-Aldrich Corporation)
5) Solvent: 39 wt % of dimethyladipate
6) Diffusing agent: 39 wt % of titanium dioxide dispersion (a TiO$_2$ solid content: 20 wt %, an average particle diameter: 200 nm, Ditto Technology)
7) Thiol additive: 2 wt % of glycol di-3-mercaptopropionate (BRUNO BOCK)
8) Other additives: 0.9 wt % of a fluorine-based surfactant (F-554, DIC Co., Ltd.)

Specifically, the photopolymerization initiator was dissolved in the solvent, and the solution was sufficiently stirred at room temperature for 2 hours. Subsequently, the binder resin along with the photo-conversion material and the dispersing agent (TEGO D685 made by EVONIK) were added thereto, and the obtained mixture was stirred again at room temperature for 2 hours. Then, the diffusing agent and the fluorine-based surfactant were added thereto and then, stirred for 1 hour at room temperature, and the product therein was filtered three times to remove impurities to prepare the photosensitive resin composition.

Evaluation 5: Photo-Conversion Rate and Photo-Conversion Maintenance Rate of Quantum Dots The curable compositions according to Examples 6 and 7 were respectively coated to be 2 μm thick on a glass substrate with a spin coater (150 rpm, Opticoat MS-A150, Mikasa Co., Ltd.) and then, dried on a hot-plate at 80° C. for 1 minute to obtain a short film, and an initial blue photo-conversion rate thereof was measured (First Step).

The obtained film was dried in a forced convection dryer at 220° C. for 40 minutes, and a blue photo-conversion rate thereof was measured (Second Step).

In the first and second steps, a photo-conversion rate and a photo-conversion maintenance rate of incident blue light from BLU (Backlight Unit) into green were evaluated, and the results are shown in Table 12. Herein, a blue photo conversion rate (Green/Blue) was measured by utilizing a CAS 140 CT spectrometer and specifically, through putting (e.g., loading) a bare glass on blue BLU (455 nm) covered with a diffusing film to first obtain a reference with a detector, putting (e.g., loading) each short film coated with the solvent-based curable compositions according to Examples 6 to 7, and calculating a peak increase converted into green light relative to an absorption peak decrease of blue light. That is, the photo-conversion rate is calculate as the ratio of the amount of increase in the peak height of the green light to the amount of decrease in the peak height of the blue light in the absorption spectrum, each based on the bare glass on blue BLU (455 nm) covered with the diffusing film. In addition, how much the photo-conversion rate in the first step was maintained in the second step, that is, a photo-conversion maintenance rate from the first step to the second step was also measured, and the results are shown in Table 12.

In addition, as for the solvent-based curable composition of Example 7, a photo-conversion rate was measured with an exposer (ghi broadband, Ushio Inc.) by performing post-baking (POB) in a convection clean oven (Jongro) at 180° C. for 30 minutes after irradiating UV with a power of 100 mJ/cm$^2$, and the results are shown in Table 13.

TABLE 12

(unit: %)

|  | Example 6 | Example 7 |
|---|---|---|
| Photo-conversion rate | 28 | 25 |
| Photo-conversion maintenance rate | 95 | 93 |

TABLE 13

(unit: %)

|  | Example 7 |
|---|---|
| Initial photo-conversion rate | 25 |
| Photo-conversion rate after POB is once performed at 180° C. for 30 min | 21.8 |

As shown in Tables 12 and 13, the solvent-based curable composition prepared by utilizing surface-modified quantum dots according to an embodiment exhibited small deterioration of a blue photo-conversion rate due to a color filter process but exhibited a high photo-conversion maintenance rate.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, or 35 U.S.C. § 112(a), and 35 U.S.C. § 132(a).

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While this disclosure has been described in connection with what is presently considered to be practical example embodiments, it is to be understood that the subject matter of the present disclosure is not limited to the disclosed embodiments, but, on the contrary, is intended to cover various modifications and equivalent arrangements included within the spirit and scope of the appended claims, and equivalents thereof. Therefore, the aforementioned embodiments should be understood to be exemplary but not limiting the subject matter of the present disclosure in any way.

What is claimed is:

1. A quantum dot surface-modified with one or more compounds represented by Chemical Formula 1 to Chemical Formula 6 and Chemical Formula 8 to Chemical Formula 14:

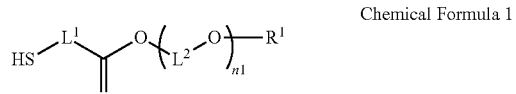

Chemical Formula 1

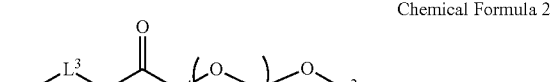

Chemical Formula 2

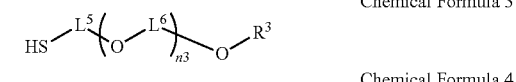

Chemical Formula 3

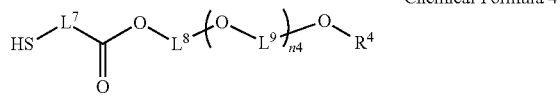

Chemical Formula 4

Chemical Formula 5

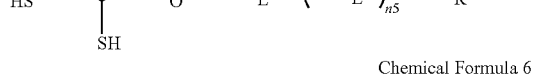

Chemical Formula 6

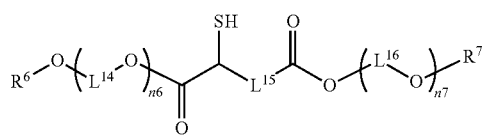

wherein, in Chemical Formula 1 to Chemical Formula 6,
$R^1$ to $R^7$ are each independently a substituted or unsubstituted C1 to C10 alkyl group or a substituted or unsubstituted C6 to C20 aryl group,
$L^1$ and $L^5$ are each independently a substituted or unsubstituted C3 to C10 alkylene group,
$L^2$ to $L^4$ and $L^7$ to $L^{16}$ are each independently a substituted or unsubstituted C1 to C10 alkylene group,
$L^6$ is a substituted or unsubstituted C1 or C3 to C10 alkylene group,
n1 is an integer of 1 to 10, and
n2 to n7 are each independently an integer of 0 to 10, Chemical Formula 8

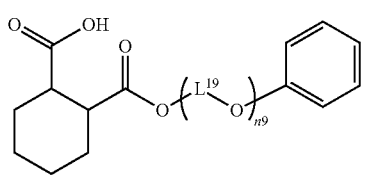

Chemical Formula 9

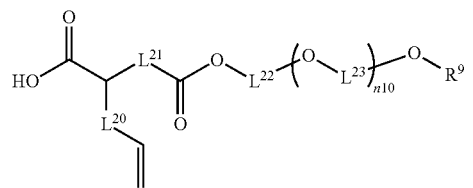

wherein, in Chemical Formula 8 to Chemical Formula 9,
$R^9$ in Chemical Formula 9 is a substituted or unsubstituted C1 to C10 alkyl group,
$L^{19}$ to $L^{23}$ are each independently a substituted or unsubstituted C1 to C10 alkylene group, and
n9 to n10 are each independently an integer of 0 to 10, Chemical Formula 10

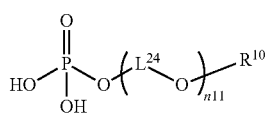

Chemical Formula 11

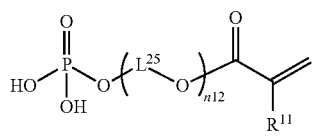

Chemical Formula 12

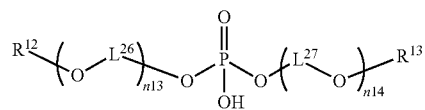

Chemical Formula 13

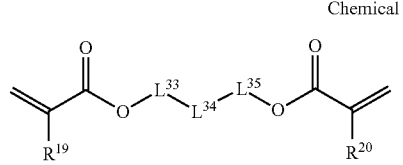

wherein, in Chemical Formula 10 to Chemical Formula 13,
$R^{10}$ in Chemical Formula 10 is a substituted or unsubstituted C2 to C10 alkyl group, $R^{11}$ to $R^{15}$ in Chemical Formula 11 to Chemical Formula 13 are each independently a hydrogen atom or a substituted or unsubstituted C1 to C10 alkyl group,
$L^{24}$ to $L^{29}$ are each independently a substituted or unsubstituted C1 to C10 alkylene group, and
n11 to n16 are each independently an integer of 0 to 10, Chemical Formula 14

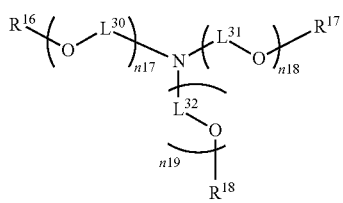

wherein, in Chemical Formula 14,
$R^{16}$ to $R^{18}$ are each independently a substituted or unsubstituted C1 to C10 alkyl group,
$L^{30}$ to $L^{32}$ are each independently a substituted or unsubstituted C1 to C10 alkylene group, and
n17 to n19 are each independently an integer of 0 to 10.

2. The quantum dot of claim 1, wherein the quantum dot has a maximum fluorescence emission wavelength at about 500 nm to about 680 nm.

3. A non-solvent curable composition comprising
the quantum dot of claim 1, and
a polymerizable monomer having a carbon-carbon double bond at a terminal end of the polymerizable monomer,
wherein the polymerizable monomer is about 40 wt % to about 80 wt % in amount based on a total weight of the non-solvent curable composition, and
the non-solvent curable composition does not contain any solvent.

4. The non-solvent curable composition of claim 3, wherein the polymerizable monomer has a molecular weight of about 220 g/mol to about 1,000 g/mol.

5. The non-solvent curable composition of claim 3, wherein the polymerizable monomer is represented by Chemical Formula 15:

Chemical Formula 15

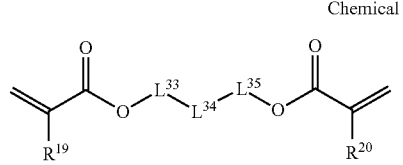

wherein, in Chemical Formula 15,
$R^{19}$ and $R^{20}$ are each independently a hydrogen atom or a substituted or unsubstituted C1 to C10 alkyl group,
$L^{33}$ and $L^{35}$ are each independently a substituted or unsubstituted C1 to C10 alkylene group, and
$L^{34}$ is a substituted or unsubstituted C1 to C10 alkylene group or an ether group.

6. The non-solvent curable composition of claim 3, wherein the non-solvent curable composition further comprises a polymerization initiator, a light diffusing agent, or a combination thereof.

7. The non-solvent curable composition of claim 6, wherein the light diffusing agent comprises barium sulfate, calcium carbonate, titanium dioxide, zirconia, or a combination thereof.

8. The non-solvent curable composition of claim 6, wherein the non-solvent curable composition further comprises a polymerization inhibitor; malonic acid; 3-amino-1,2-propanediol; a silane-based coupling agent; a leveling agent; a fluorine-based surfactant; or a combination thereof.

9. A cured layer manufactured utilizing the composition of claim 3.

10. A color filter comprising the cured layer of claim 9.

11. A display device comprising the color filter of claim 10.

12. A method of manufacturing a cured layer, the method comprising:
applying the composition of claim 3 onto a substrate by an ink-jet method to form a pattern; and
curing the pattern.

13. A method of manufacturing a cured layer, the method comprising:
applying the composition of claim 3 onto a substrate by an ink-jet method to form a pattern;
developing the pattern; and
heat-treating the pattern.

14. A solvent-based curable composition comprising
the quantum dot of claim 1;
a binder resin; and
a solvent.

15. The solvent-based curable composition of claim 14, wherein the solvent-based curable composition further comprises a polymerizable monomer, a polymerization initiator, a light diffusing agent, or a combination thereof.

16. The solvent-based curable composition of claim 14, wherein the solvent-based curable composition is a photosensitive resin composition.

17. A cured layer manufactured utilizing the composition of claim 14.

18. A color filter comprising the cured layer of claim 17.

19. A display device comprising the color filter of claim 18.

20. A method of manufacturing a cured layer, the method comprising:
applying the composition of claim 14 onto a substrate by an ink-jet method to form a pattern; and
curing the pattern.

21. A method of manufacturing a cured layer, the method comprising:
applying the composition of claim 14 onto a substrate by an ink-jet method to form a pattern;
developing the pattern; and
heat-treating the pattern.

* * * * *